(12) United States Patent
Amin et al.

(10) Patent No.: US 11,765,846 B2
(45) Date of Patent: *Sep. 19, 2023

(54) DISPLAY SCREEN PROTECTOR

(71) Applicant: CORNING INCORPORATED, Corning, NY (US)

(72) Inventors: Jaymin Amin, Corning, NY (US); Joshua Michael Jacobs, Corning, NY (US); Jonathan David Pesansky, Corning, NY (US); Kevin Barry Reiman, Horseheads, NY (US); Ananthanarayanan Subramanian, Corning, NY (US)

(73) Assignee: CORNING INCORPORATED, Corning, NY (US)

( * ) Notice: Subject to any disclaimer, the term of this patent is extended or adjusted under 35 U.S.C. 154(b) by 181 days.

This patent is subject to a terminal disclaimer.

(21) Appl. No.: 17/170,147

(22) Filed: Feb. 8, 2021

(65) Prior Publication Data

US 2021/0168957 A1 Jun. 3, 2021

Related U.S. Application Data

(63) Continuation of application No. 16/363,208, filed on Mar. 25, 2019, now Pat. No. 10,917,989, which is a
(Continued)

(51) Int. Cl.
*H05K 5/03* (2006.01)
*B32B 17/06* (2006.01)
(Continued)

(52) U.S. Cl.
CPC .............. *H05K 5/03* (2013.01); *B32B 7/12* (2013.01); *B32B 17/06* (2013.01);
(Continued)

(58) Field of Classification Search
None
See application file for complete search history.

(56) References Cited

U.S. PATENT DOCUMENTS 7,070,837 B2  7/2006  Ross
8,044,942 B1  10/2011  Leonhard et al.
(Continued)

FOREIGN PATENT DOCUMENTS

CN     201465450 U    5/2010
CN     201557345 U    8/2010
(Continued)

OTHER PUBLICATIONS

"Introduction to Mechanical Testing and Evaluation"; ASM Handbook, vol. 8, 2000; pp. 3-12.
(Continued)

*Primary Examiner* — David Sample
(74) *Attorney, Agent, or Firm* — Travis B. Gasa

(57) ABSTRACT

Disclosed are device display screen protectors comprising a first strengthened substrate sized to cover a display screen of an electronic device, the first strengthened substrate having a central tension value in the range greater than 0 MPa and less than 20 MPa, a surface having a Knoop lateral cracking scratch threshold of at least 3 N.

17 Claims, 12 Drawing Sheets

Related U.S. Application Data continuation of application No. 15/711,379, filed on Sep. 21, 2017, now Pat. No. 10,244,648, which is a continuation of application No. 15/353,333, filed on Nov. 16, 2016, now Pat. No. 9,801,297.

(60) Provisional application No. 62/350,969, filed on Jun. 16, 2016, provisional application No. 62/319,884, filed on Apr. 8, 2016, provisional application No. 62/257,449, filed on Nov. 19, 2015.

(51) Int. Cl.
| | | |
|---|---|---|
| *B32B 17/10* | (2006.01) | |
| *B32B 7/12* | (2006.01) | |
| *C03C 21/00* | (2006.01) | |
| *C03C 23/00* | (2006.01) | |
| *C03C 3/093* | (2006.01) | |
| *H05K 5/00* | (2006.01) | |

(52) U.S. Cl.
CPC .... *B32B 17/10036* (2013.01); *B32B 17/1077* (2013.01); *B32B 17/10091* (2013.01); *B32B 17/10119* (2013.01); *B32B 17/10137* (2013.01); *B32B 17/10743* (2013.01); *B32B 17/10761* (2013.01); *B32B 17/10788* (2013.01); *B32B 17/10798* (2013.01); *C03C 3/093* (2013.01); *C03C 21/002* (2013.01); *C03C 21/005* (2013.01); *C03C 23/007* (2013.01); *H05K 5/0017* (2013.01); *B32B 2307/584* (2013.01); *B32B 2457/20* (2013.01)

(56) References Cited

U.S. PATENT DOCUMENTS

| | | | |
|---|---|---|---|
| 8,187,987 | B2 | 5/2012 | Amin et al. |
| 8,586,492 | B2 | 11/2013 | Barefoot et al. |
| 8,642,173 | B2 | 2/2014 | O'Donnell |
| 8,929,068 | B2 | 1/2015 | Richardson |
| 8,937,689 | B2 | 1/2015 | Prest et al. |
| 8,951,927 | B2 | 2/2015 | Dejneka et al. |
| 8,974,620 | B2 | 3/2015 | Wilson et al. |
| 9,001,502 | B1 | 4/2015 | Cowan |
| 9,063,699 | B1 | 6/2015 | Huang |
| 9,092,195 | B1 | 7/2015 | Huang |
| 9,128,545 | B2 | 9/2015 | Wilson et al. |
| 9,139,469 | B2 | 9/2015 | Comte et al. |
| 9,156,724 | B2 | 10/2015 | Gross |
| 9,235,240 | B2 | 1/2016 | Pakula et al. |
| 9,287,916 | B2 | 3/2016 | Wicks et al. |
| 9,292,128 | B1 | 3/2016 | Huang |
| 9,801,297 | B2 | 10/2017 | Amin et al. |
| 10,227,253 | B2 | 3/2019 | Gomez et al. |
| 10,244,648 | B2 | 3/2019 | Amin et al. |
| 10,917,989 | B2 * | 2/2021 | Amin ................ B32B 17/10798 |
| 2004/0227722 | A1 | 11/2004 | Friberg et al. |
| 2007/0279853 | A1 | 12/2007 | Hung et al. |
| 2009/0197048 | A1 | 8/2009 | Amin et al. |
| 2009/0202808 | A1 | 8/2009 | Glaesemann et al. |
| 2009/0220761 | A1* | 9/2009 | Dejneka ................ C03C 21/002 |
| | | | 501/67 |
| 2010/0279067 | A1 | 11/2010 | Sabia et al. |
| 2010/0291353 | A1 | 11/2010 | Dejneka et al. |
| 2011/0187245 | A1 | 8/2011 | Pakula et al. |
| 2011/0281093 | A1 | 11/2011 | Gulati et al. |
| 2011/0300908 | A1 | 12/2011 | Grespan et al. |
| 2012/0183712 | A1 | 7/2012 | Leonhard et al. |
| 2012/0183713 | A1 | 7/2012 | Leonhard et al. |
| 2012/0236477 | A1 | 9/2012 | Weber |
| 2012/0236526 | A1 | 9/2012 | Weber |
| 2013/0004758 | A1 | 1/2013 | Dejneka et al. |
| 2013/0069502 | A1 | 3/2013 | Hu et al. |
| 2013/0122284 | A1* | 5/2013 | Gross ................ C03C 3/087 |
| | | | 501/63 |
| 2013/0169590 | A1 | 7/2013 | Wickboldt et al. |
| 2013/0183489 | A1 | 7/2013 | Cremer et al. |
| 2013/0189486 | A1* | 7/2013 | Wang ................ C03C 21/002 |
| | | | 501/63 |
| 2013/0199950 | A1 | 8/2013 | Feller |
| 2014/0065401 | A1 | 3/2014 | Donovan et al. |
| 2014/0072749 | A1 | 3/2014 | Leonhard et al. |
| 2014/0090864 | A1 | 4/2014 | Paulson |
| 2014/0106141 | A1 | 4/2014 | Bellman et al. |
| 2014/0106146 | A1 | 4/2014 | Decker et al. |
| 2014/0106150 | A1 | 4/2014 | Decker et al. |
| 2014/0128131 | A1 | 5/2014 | Sin |
| 2014/0168864 | A1* | 6/2014 | Lin ................ G02F 1/133308 |
| | | | 361/679.01 |
| 2014/0170380 | A1 | 6/2014 | Murata et al. |
| 2014/0226090 | A1 | 8/2014 | Akiba et al. |
| 2014/0227523 | A1 | 8/2014 | Dejneka et al. |
| 2014/0227525 | A1 | 8/2014 | Matsuda et al. |
| 2014/0248495 | A1 | 9/2014 | Matsuda et al. |
| 2014/0364178 | A1 | 12/2014 | Hynecek et al. |
| 2014/0370302 | A1 | 12/2014 | Amin et al. |
| 2014/0370303 | A1 | 12/2014 | Jin et al. |
| 2015/0013891 | A1 | 1/2015 | Wilson et al. |
| 2015/0030834 | A1 | 1/2015 | Morey et al. |
| 2015/0051060 | A1 | 2/2015 | Ellison et al. |
| 2015/0056395 | A1 | 2/2015 | Lin |
| 2015/0064473 | A1 | 3/2015 | Dejneka et al. |
| 2015/0079400 | A1 | 3/2015 | Fu et al. |
| 2015/0118276 | A1 | 4/2015 | Borrelli et al. |
| 2015/0140299 | A1 | 5/2015 | Ellison et al. |
| 2015/0147538 | A1 | 5/2015 | Ishimaru et al. |
| 2015/0147576 | A1 | 5/2015 | Bookbinder et al. |
| 2015/0153775 | A1 | 6/2015 | Cheng et al. |
| 2015/0153776 | A1 | 6/2015 | Cheng et al. |
| 2015/0225287 | A1 | 8/2015 | Amin et al. |
| 2015/0225288 | A1 | 8/2015 | Bookbinder et al. |
| 2015/0239777 | A1 | 8/2015 | Mauro |
| 2015/0248142 | A1 | 9/2015 | Qian et al. |
| 2015/0307392 | A1 | 10/2015 | Castle et al. |
| 2015/0314571 | A1 | 11/2015 | Cites et al. |
| 2015/0323961 | A1 | 11/2015 | Leonhard et al. |
| 2015/0336843 | A1 | 11/2015 | Gomez et al. |
| 2015/0353418 | A1 | 12/2015 | Damm et al. |
| 2016/0002103 | A1 | 1/2016 | Wang et al. |

FOREIGN PATENT DOCUMENTS

| | | |
|---|---|---|
| CN | 101939267 A | 1/2011 |
| CN | 102388003 A | 3/2012 |
| CN | 202495212 U | 10/2012 |
| CN | 202617186 U | 12/2012 |
| CN | 202784250 U | 3/2013 |
| CN | 103068759 A | 4/2013 |
| CN | 202864022 U | 4/2013 |
| CN | 203313229 U | 11/2013 |
| CN | 203433748 U | 2/2014 |
| CN | 103842310 A | 6/2014 |
| CN | 104114503 A | 10/2014 |
| CN | 204109477 U | 1/2015 |
| CN | 204109479 U | 1/2015 |
| CN | 104333629 A | 2/2015 |
| CN | 204350057 U | 5/2015 |
| CN | 104703937 A | 6/2015 |
| EP | 2535792 A1 | 12/2012 |
| EP | 2762459 A1 | 8/2014 |
| JP | 03-194930 A | 8/1991 |
| JP | 2011-510903 A | 4/2011 |
| JP | 2013-502371 A | 1/2013 |
| JP | 2013-177304 A | 9/2013 |
| JP | 3194930 U | 12/2014 |
| JP | 2015-034107 A | 2/2015 |
| JP | 2015-148650 A | 8/2015 |
| KR | 10-0460258 B1 | 12/2004 |
| TW | M463373 U | 10/2013 |
| TW | M473303 U | 3/2014 |
| WO | 2004/114342 A1 | 12/2004 |
| WO | 2009/099614 A1 | 8/2009 |
| WO | 2010/021746 A1 | 2/2010 |
| WO | 2011/097314 A2 | 8/2011 |

(56) References Cited

FOREIGN PATENT DOCUMENTS

| WO | 2011/103798 | A1 | | 9/2011 | |
|----|----|----|----|----|----|
| WO | WO-2011103798 | A1 | * | 9/2011 | ........... C03C 21/002 |
| WO | 2012/051038 | A1 | | 4/2012 | |
| WO | 2014/015840 | A1 | | 1/2014 | |
| WO | 2014/036267 | A1 | | 3/2014 | |
| WO | 2014/059411 | A1 | | 4/2014 | |
| WO | 2014/059412 | A1 | | 4/2014 | |
| WO | 2014/182596 | A1 | | 11/2014 | |
| WO | 2014/190014 | A1 | | 11/2014 | |
| WO | 2014/197874 | A1 | | 12/2014 | |
| WO | 2015/077109 | A1 | | 5/2015 | |
| WO | 2015/138660 | A1 | | 9/2015 | |
| WO | 2015/148618 | A1 | | 10/2015 | |
| WO | 2015/178175 | A1 | | 11/2015 | |
| WO | 2015/179345 | A1 | | 11/2015 | |
| WO | 2015/197345 | A1 | | 12/2015 | |
| WO | 2016/024341 | A1 | | 2/2016 | |

OTHER PUBLICATIONS

ASM International Handbook vol. 08 (2000): Mechanical Testing and Evaluation, 11 pages.
ASTM-E384-11, "Standard Test Method for Knoop and Vickers Hardness of Materials", 43 pages, downloaded Dec. 12, 2016.
International Search Report and Written Opinion of the International Searching Authority; PCT/US2016/062128; dated Mar. 8, 2017; 11 Pages; European Patent Office.
Japanese Industrial Standard JIS Z 2801 (2000), entitled Antimicrobial Products—Test for Antimicrobial Activity and Efficacy.
Japanese Patent Application No. 2018-525680, Office Action dated Oct. 7, 2020, 12 pages (6 pages of English Translation and 6 pages of Original Document); Japanese Patent Office.
JIS Z 2801 (2010) Antibacterial Products—Test for Antibacterial Activity and Efficacy; Japanese Industrial Standard; 2010; 27 Pages.
Physics and chemistry of antimicrobial behavior of ion-exchanged silver in glass (Article) Borrelli, N.F., Senaratne, W., Wei, Y., Petzold, O. ACS Applied Materials and Interfaces vol. 7, Issue 4, Feb. 4, 2015, pp. 2195-2201.
Taiwanese Patent Application No. 105137157, Office Action dated Feb. 18, 2021, 2 pages (English Translation Only); Taiwanese Patent Office.
Chinese Patent Application No. 201680067925.5, Office Action dated Dec. 2, 2021, 24 pages (15 pages of English Translation and 9 pages of Original Copy, Chinese Patent Office.
Ma Yanping, "Glass Processing Technology", Northwest University press, May 2008, 6 pages (3 pages of English translation and 3 pages of original document).

* cited by examiner

DISPLAY SCREEN PROTECTOR

CROSS-REFERENCE TO RELATED APPLICATIONS

This application is a continuation of U.S. patent application Ser. No. 16/363,208 filed on Mar. 25, 2019, which is a continuation of U.S. patent application Ser. No. 15/711,379 filed on Sep. 21, 2017, which is a continuation of U.S. patent application Ser. No. 15/353,333 filed on Nov. 16, 2016, which claims the benefit of priority under 35 U.S.C. § 119 of U.S. Provisional Application Ser. No. 62/350,969 filed on Jun. 16, 2016, U.S. Provisional Application Ser. No. 62/319,884 filed on Apr. 8, 2016, and U.S. Provisional Application Ser. No. 62/257,449 filed on Nov. 19, 2015, the content of which is relied upon and incorporated herein by reference in its entirety.

FIELD

Embodiments of the disclosure generally relate to device display screen protectors and methods of protecting display screens of devices.

BACKGROUND

Electronic devices, for example, handheld electronic devices such as mobile phones and tablets include a cover substrate, which is typically a glass substrate and is typically referred to as a cover glass. However, breakage of the cover glass of electronic devices is a persistent problem. The failure and breakage of cover glass can be attributed to flexural failure, caused by the bending of glass when the device is subjected to dynamic or static loading, as well as sharp contact failure, caused by damage introduction due to sharp indentation on the glass surface when the cover glass falls on a rough surface such as asphalt, concrete, etc.

Manufacturers of glass and electronic devices have researched improvements to provide resistance to and/or prevent sharp contact failure. Some proposed improvements include coatings on the cover glass and bezels that prevent the cover glass from contacting the ground directly when the device is dropped. However due to the constraints of aesthetic and functional requirements, it is very difficult to prevent completely the cover glass from contacting the ground when the device is dropped. Also, it has been shown that hard coatings on strong ion exchanged glass, which is used to make cover glass, can deteriorate its flexural strength performance. Accordingly, it would be desirable to provide screen protectors and methods of protecting display screens of electronic devices to provide improved survivability of cover glass for these electronic devices.

SUMMARY

A first aspect of the disclosure pertains to a device display screen protector comprising a first strengthened substrate sized to cover a display screen of an electronic device, the first strengthened substrate having a central tension value in the range greater than 0 MPa and less than 20 MPa and a surface having a Knoop lateral cracking scratch threshold of at least 3 N.

Another aspect of the disclosure pertains to a method of protecting a display screen of an electronic device, the method comprising covering a screen of the electronic device with a first strengthened substrate having a central tension value in the range greater than 0 MPa and less than 20 MPa and a surface having a Knoop lateral cracking scratch threshold of at least 3 N.

Another aspect of the disclosure pertains to a device comprising a housing having a front surface, a back surface, and side surfaces; electrical components provided at least partially inside the housing; a display at or adjacent the front surface of the housing; and the display screen protector described herein disposed over the display.

BRIEF DESCRIPTION OF THE DRAWINGS

The accompanying figures, which are incorporated in and constitute a part of this specification, illustrate several embodiments described below.

DETAILED DESCRIPTION

Figure 1:
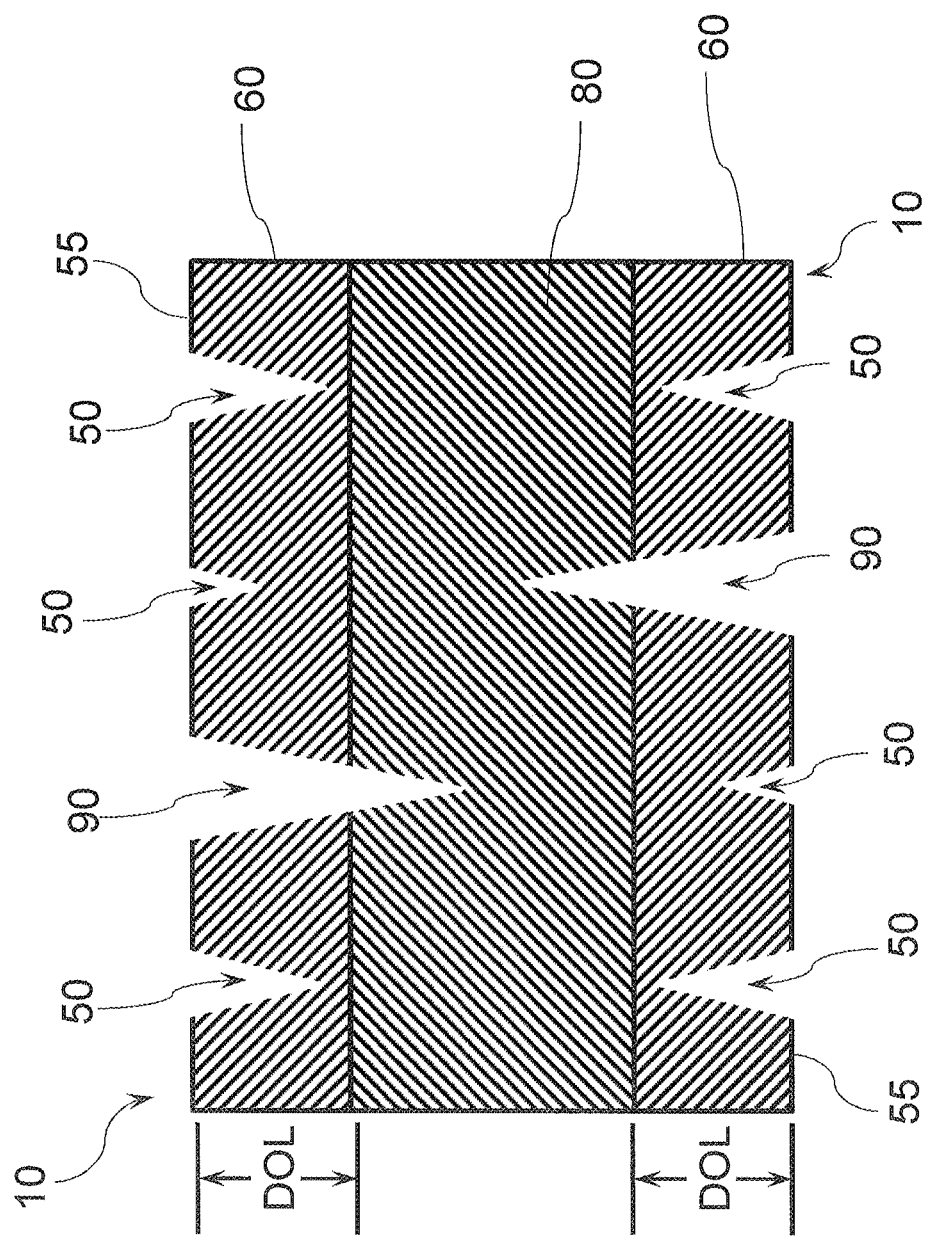
FIG. 1 illustrates an embodiment of a cross-sectional view of a screen protector with a surface having a plurality of cracks.

Before describing several exemplary embodiments, it is to be understood that the disclosure is not limited to the details of construction or process steps set forth in the following disclosure. The disclosure provided herein is capable of other embodiments and of being practiced or being carried out in various ways.

Embodiments of the disclosure provide a device display screen protector comprising a first strengthened glass substrate sized and configured to cover a display screen of an electronic device, for example, a handheld device, or a handheld electronic device.

One or more embodiments described herein pertain to a portion of a housing for an electronic device. In an embodiment, the housing can include an outer member, which can be a strengthened glass substrate having a central tension value and a Knoop scratch resistance value as described further herein. The strengthened glass substrate can be secured with respect to other portions of the housing for the electronic device. The electronic device can be portable and in some cases handheld. According to one or more embodiments, "handheld device" refers to a portable electronic device that has a display screen. Non-limiting examples of such handheld devices include a mobile telephone, a reading device, a music device, a viewing device and a navigation device. Non-limiting examples of such devices are iPhone®, Nook®, iPod®, iPad®, Droid®, Kindle® and GPS navigation systems. In one or more embodiments, the screen protectors and strengthened glass substrates described herein can also be used to cover displays for other electronic devices including, but not limited to, relatively larger form factor electronic devices (e.g., portable computers, tablet computers, displays, monitors, televisions, etc.).

The substrates used herein can be glass-based substrates such as amorphous substrates or glass-ceramic substrates. Amorphous substrates according to one or more embodiments can be selected from soda lime glass, alkali aluminosilicate glass, alkali containing borosilicate glass and alkali aluminoborosilicate glass. In one or more embodiments, the substrate is a glass, and the glass can be strengthened, for example, heat strengthened, tempered glass, or chemically strengthened glass. In one or more embodiments, strengthened glass substrates have a compressive stress (CS) layer with a CS extending within the chemically strengthened glass from a surface of the chemically strengthened glass to a compressive stress depth of layer (DOL) in a range of 0.5 microns to 50 microns deep. In one or more embodiments, the glass substrate is a chemically strengthened glass substrate such as Corning Gorilla® glass.

In strengthened glass substrates, there is a stress profile in which there is a compressive stress (CS) on the surface and tension (central tension, or CT) in the center of the glass. According to one or more embodiments, the screen protector can be thermally strengthened, chemically strengthened, or a combination of thermally strengthened and chemically strengthened. As used herein, "thermally strengthened" refers to substrates that are heat treated to improve the strength of the substrate, and "thermally strengthened" includes tempered substrates and heat-strengthened substrates, for example tempered glass and heat-strengthened glass. Tempered glass involves an accelerated cooling process, which creates higher surface compression and/or edge compression in the glass. Factors that impact the degree of surface compression include the air-quench temperature, volume, and other variables that create a surface compression of at least 10,000 pounds per square inch (psi). Tempered glass is typically four to five times stronger than annealed or untreated glass. Heat-strengthened glass is produced by a lower differential cooling than tempered glass, which results in a lower compression strength at the surface and heat-strengthened glass is approximately twice as strong as annealed, or untreated, glass.

In chemically strengthened glass substrates, the replacement of smaller ions by larger ions at a temperature below that at which the glass network can significantly relax produces a distribution of ions across the surface of the glass that results in a stress profile. The larger volume of the incoming ion produces a compressive stress (CS) on the surface and tension (central tension, or CT) in the center of the glass. The compressive stress is related to the central tension by the following approximate relationship (Equation 1):

$$CT \cong \frac{CS \times DOL}{\text{thickness} - (2 \times DOL)}$$

where thickness is the total thickness of the strengthened glass substrate and DOL is the depth of exchange. Depth of exchange may be described as the depth within the strengthened glass or glass ceramic substrate (i.e., the distance from a surface of the glass substrate to an interior region of the glass or glass ceramic substrate), at which ion exchange facilitated by the ion exchange process takes place. Unless otherwise specified, central tension CT and compressive stress CS are expressed herein in megaPascals (MPa), whereas thickness and depth of layer DOL are expressed in millimeters or microns (micrometers). It will be appreciated that CT is dependent on three parameters—CS, DOL and thickness. As an example, to maintain a CT value, for example at 30 MPa or less, as the DOL is increased, either the CS would need to be decreased or the thickness would need to be increased to maintain the CT at 30 MPa or less. CS and DOL are measured using those means known in the art, such as by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass, as well as upon the material refractive index. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety.

Referring now to FIG. 1, an exemplary embodiment of a cross-sectional view of a screen protector comprising a first strengthened substrate 10 is illustrated. The first strengthened substrate 10 is shown as having a plurality of cracks, illustrating how subsurface damage can result in a failure of the first strengthened substrate 10. A first strengthened substrate 10 has compressive stress regions 60 at the surfaces and a central tension region 80. The compressive depth of layer is shown as DOL on each side of the substrate 10 in FIG. 1. Small cracks 50 in the compressive stress regions 60 of the first strengthened substrate 10 that do not extend into the central tension regions 80 of the glass are shown, along with a large cracks 90 that penetrate into the central tension regions 80 of the glass. It will be appreciated that the size of the features, namely the small cracks 50 and large cracks 90 are exaggerated to illustrate the concept. If the damage extends beyond the DOL, and if the central tension is of a high enough magnitude, the flaw will propagate until it reaches the material's critical stress intensity level and will ultimately fracture the glass.

According to one or more embodiments, the CT can be varied by changing the thickness of the chemically strengthened glass substrate, while maintaining the same compressive stress magnitude and compressive stress DOL. In one or more embodiments, CS and/or DOL may be reduced at a constant desired thickness to vary the CT.

According to one or more embodiments, the first strengthened glass substrate has an external surface 55 that is exposed to a user of the device, and the external surface 55 is susceptible to sharp contact damage, for example, when the device is dropped by a user of the device. According to one or more embodiments, the first strengthened substrate 10 is can be a chemically strengthened glass substrate, a thermally strengthened glass substrate or a glass substrate that is both chemically strengthened and thermally strengthened. "Thermally strengthened" includes tempered and heat-strengthened glass as discussed above. According to one or more embodiments, "chemically strengthened" refers to glass that is treated at the surface with ions, typically by ion exchange, to produce a compressive stress in the glass substrate.

The first strengthened glass substrates may be provided using a variety of different processes. For example, exemplary glass substrate forming methods include float glass processes and down-draw processes such as fusion draw and slot draw. A glass substrate prepared by a float glass process may be characterized by smooth surfaces and uniform thickness is made by floating molten glass on a bed of molten metal, typically tin. In an example process, molten glass that is fed onto the surface of the molten tin bed forms a floating glass ribbon. As the glass ribbon flows along the tin bath, the temperature is gradually decreased until the glass ribbon solidifies into a solid glass substrate that can be lifted from the tin onto rollers. Once off the bath, the glass substrate can be cooled further and annealed to reduce internal stress.

Down-draw processes produce glass substrates having a uniform thickness that possess relatively pristine surfaces. Because the average flexural strength of the glass substrate is controlled by the amount and size of surface flaws, a pristine surface that has had minimal contact has a higher initial strength. When this high strength glass substrate is then further strengthened (e.g., chemically), the resultant strength can be higher than that of a glass substrate with a surface that has been lapped and polished. Down-drawn glass substrates may be drawn to a thickness of less than about 2 mm. In addition, down drawn glass substrates have a very flat, smooth surface that can be used in its final application without costly grinding and polishing.

The fusion draw process, for example, uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank as two flowing glass films. These outside surfaces of the drawing tank extend down and inwardly so that they join at an edge below the drawing tank. The two flowing glass films join at this edge to fuse and form a single flowing glass substrate. The fusion draw method offers the advantage that, because the two glass films flowing over the channel fuse together, neither of the outside surfaces of the resulting glass substrate comes in contact with any part of the apparatus. Thus, the surface properties of the fusion drawn glass substrate are not affected by such contact.

The slot draw process is distinct from the fusion draw method. In slow draw processes, the molten raw material glass is provided to a drawing tank. The bottom of the drawing tank has an open slot with a nozzle that extends the length of the slot. The molten glass flows through the slot/nozzle and is drawn downward as a continuous substrate and into an annealing region.

In some embodiments, the compositions used for the glass substrate may be batched with 0-2 mol. % of at least one fining agent selected from a group that includes $Na_2SO_4$, NaCl, NaF, NaBr, $K_2SO_4$, KCl, KF, KBr, and $SnO_2$.

Once formed, a glass substrate may be strengthened to form a strengthened glass substrate to provide the first strengthened substrate 10. It should be noted that glass ceramic substrates may also be strengthened in the same manner as glass substrates. As used herein, the term "strengthened substrate" may refer to a glass substrate or a glass ceramic substrates that has been chemically strengthened, for example through ion-exchange of larger ions for smaller ions in the surface of the glass or glass ceramic substrate. However, as discussed above, thermal strengthening methods known in the art, such as thermal tempering or heat strengthening, may be utilized to form strengthened glass substrates. In some embodiments, the substrates may be strengthened using a combination of chemical strengthening processes and thermally strengthening processes.

The strengthened substrates described herein may be chemically strengthened by an ion exchange process. In the ion-exchange process, typically by immersion of a glass or glass ceramic substrate into a molten salt bath for a predetermined period of time, ions at or near the surface(s) of the glass or glass ceramic substrate are exchanged for larger metal ions from the salt bath. In one embodiment, the temperature of the molten salt bath is about 360-450° C. and the predetermined time period is about two to about fourteen hours. The incorporation of the larger ions into the glass or glass ceramic substrate strengthens the substrate by creating a compressive stress in a near surface region or in regions at and adjacent to the surface(s) of the substrate. A corresponding tensile stress is induced within a central region or regions at a distance from the surface(s) of the substrate to balance the compressive stress. Glass or glass ceramic substrates utilizing this strengthening process may be described more specifically as chemically-strengthened or ion-exchanged glass or glass ceramic substrates.

In one example, sodium ions in a strengthened glass or glass ceramic substrate are replaced by potassium ions from the molten bath, such as a potassium nitrate salt bath, though other alkali metal ions having larger atomic radii, such as rubidium or cesium, can replace smaller alkali metal ions in the glass. According to particular embodiments, smaller alkali metal ions in the glass or glass ceramic can be replaced by Ag+ ions to provide an antimicrobial effect. Similarly, other alkali metal salts such as, but not limited to, sulfates, phosphates, halides, and the like may be used in the ion exchange process.

The replacement of smaller ions by larger ions at a temperature below that at which the glass network can significantly relax produces a distribution of ions across the surface(s) of the strengthened substrate that results in a stress profile. The larger volume of the incoming ion produces a compressive stress (CS) on the surface and tension (central tension, or CT) in the center of the strengthened substrate. The compressive stress is related to the central tension by the following relationship (Equation 2):

$$CS=(CT \times (t-2DOL))/DOL$$

where t is the total thickness of the strengthened glass or glass ceramic substrate and compressive depth of layer (DOL) is the depth of exchange. Depth of exchange may be described as the depth within the strengthened glass or glass ceramic substrate (i.e., the distance from a surface of the glass substrate to a central region of the glass or glass ceramic substrate), at which ion exchange facilitated by the ion exchange process takes place.

In one or more embodiments, the first strengthened substrate can have a surface compressive stress of 300 MPa or greater, e.g., 400 MPa or greater, 450 MPa or greater, 500 MPa or greater, 550 MPa or greater, 600 MPa or greater, 650 MPa or greater, 700 MPa or greater, 750 MPa or greater or 800 MPa or greater. In one or more embodiments, the first strengthened substrate can have a compressive stress value in the range of 300 MPa and 900 MPa, in the range of 500 MPa and 900 MPa, in the range of in the range of 600 MPa and 900 MPa, in the range of 400 MPa and 900 MPa, in the range of 450 MPa and 850 MPa, in the range of 450 MPa and 800 MPa, in the range of 450 MPa and 750 MPa and all ranges and sub-ranges between the foregoing values. The strengthened glass or glass ceramic substrate may have a compressive depth of layer 50 µm or less, 45 µm or less, 40 µm or less, 35 µm or less, 30 µm or less, 25 µm or less, 20 µm or less, 15 µm or less, 10 µm or less, 9 µm or less, 8 µm or less, 7 µm or less, 6 µm or less, 5 µm or less or 4 µm or less. The lower limit of the compressive depth can be 0.5 µm or 1 µm or 2 µm. Central tension can be in the range of 0 to 20 MPa, or 5 to 20 MPa, or 5 to 15 MPa, or 10 to 20 MPa, or 10 to 15 MPa or 15 to 20 MPa, and all ranges and sub-ranges between the foregoing values. In one or more specific embodiments, the first strengthened substrate has a compressive stress value in the range 20 MPa and 300 MPa and a depth of layer value in the range of 20 µm and 100 µm; a compressive stress value in the range of 300 MPa and 900 MPa and a depth of layer value in the range of 2 µm and 20 µm or a compressive stress value in the range of 500 MPa and 900 MPa and a depth of layer value in the range of 2 µm and 12 µm. In other specific embodiments, the first strengthened glass substrate can have a compressive stress value in the range of 400 MPa and 800 MPa, a thickness in a range of 0.05 mm and 0.7 mm, for example 0.1 mm to 0.6 mm, a depth of layer value in a range of 1 µm and 20 µm, 1 µm and 15 µm, 1 µm and 14 µm, 1 µm and 13 µm, 1 µm and 12 µm, 1 µm and 11 µm, 1 µm and 10 µm, 1 µm and 9 µm, 1 µm and 8 µm, 1 µm and 7 µm, 1 µm and 6 µm and 1 µm and 5 µm, and a central tension value in a range of 0 and 20 MPa, 1 and 20 MPa, 1 and 19 MPa, 1 and 18 MPa, 1 and 17 MPa, 1 and 16 MPa, 1 and 15 MPa, 1 and 14 MPa, 1 and 13 MPa, 1 and 12 MPa, 1 and 11 MPa, and 1 and 10 MPa and all ranges and sub-ranges between the foregoing values for CS, thickness, DOL, and CT. According to one or more embodiments, the first strengthened glass substrate has a Knoop scratch resistance of at least at least 3 N, at least 3.5N, at least 4 N, at least 4.5 N, at least 5 N, at least 6 N, at least 7 N, at least 8 N, at least 9 N or at least 10 N. As used herein, "a Knoop scratch resistance of at least 3 N" (and other scratch resistance values) refers to minimum Knoop scratch resistance value obtained according to the Knoop lateral cracking scratch threshold test described further herein. Thus, for a Knoop scratch resistance determination, the Knoop lateral cracking scratch threshold testing includes a number of scratch measurements (for example, five), and "a Knoop scratch resistance of at least 3 N" refers to the minimum value obtained from the five measurements.

In one or more embodiments, the first strengthened substrate is an aftermarket screen protector having a thickness in the range of 0.025 and 0.7 mm and a compressive stress value in the range of 20 MPa and 300 MPa and a depth of layer value in the range of 20 µm and 100 µm. In some embodiments, the aftermarket screen protector may be a laminate of two or more substrates. In specific embodiments, the first strengthened glass substrate is an aftermarket screen protector having a thickness in the range of 0.025 and 0.7 mm and a compressive stress value in the range of 400 MPa and 800 MPa and a depth of layer value in the range of 1 µm and 50 µm, for example, in the range of 1 and 25 µm, 1 µm and 20 µm, 1 µm and 15 µm, 1 µm and 14 µm, 1 µm and 13 µm, 1 µm and 12 µm, 1 µm and 11 µm, 1 µm and 10 µm, 1 µm and 9 µm, 1 µm and 8 µm, 1 µm and 7 µm, 1 µm and 6 µm and 1 µm and 5 µm, and a central tension value in a range of 0 and 20 MPa, 1 and 20 MPa, 1 and 19 MPa, 1 and 18 MPa, 1 and 17 MPa, 1 and 16 MPa, 1 and 15 MPa, 1 and 14 MPa, 1 and 13 MPa, 1 and 12 MPa, 1 and 11 MPa, and 1 and 10 MPa and all ranges and sub-ranges between the foregoing values for thickness, CS, DOL, and CT. In one or more embodiments, the first strengthened substrate is an aftermarket screen protector having a thickness in the range of 0.025 and 0.7 mm and a compressive stress value in the range of 500 MPa and 900 MPa and a depth of layer value in the range of 1 µm and 50 µm, for example, in the range of 1 and 25 µm, 1 µm and 20 µm, 1 µm and 15 µm, 1 µm and 14 µm, 1 µm and 13 µm, 1 µm and 12 µm, 1 µm and 11 µm, 1 µm and 10 µm, 1 µm and 9 µm, 1 µm and 8 µm, 1 µm and 7 µm, 1 µm and 6 µm and 1 µm and 5 µm, and a central tension value in a range of 0 and 20 MPa, 1 and 20 MPa, 1 and 19 MPa, 1 and 18 MPa, 1 and 17 MPa, 1 and 16 MPa, 1 and 15 MPa, 1 and 14 MPa, 1 and 13 MPa, 1 and 12 MPa, 1 and 11 MPa, and 1 and 10 MPa and all ranges and sub-ranges between the foregoing values for thickness, CS, DOL, and CT. According to one or more embodiments, the first strengthened glass substrate has a Knoop scratch resistance of at least 3 N, at least 3.5N, at least 4 N, at least 4.5 N, at least 5 N, at least 6 N, at least 7 N, at least 8 N, at least 9 N or at least 10 N. In specific embodiments, the first strengthened glass substrate has a transmission in the range of 380 to 2000 nm of greater than 91%.

In one or more specific embodiments, the first strengthened substrate comprises ion exchangeable glass having a high degree of resistance to damage caused by abrasion, scratching, indentation, and the like. In specific embodiments, the glass comprises alumina, $B_2O_3$, and alkali metal oxides, and contains boron cations having three-fold coordination. The glass, when ion exchanged, has a Vickers crack initiation threshold of at least 3 kilogram force (kgf), at least 4 kilogram force (kgf), at least 5 kilogram force (kgf), at least 6 kilogram force (kgf), at least 7 kilogram force (kgf) or at least 8 kilogram force (kgf), at least 9 kilogram force (kgf) or at least 10 kilogram force (kgf).

Indentation Fracture Threshold (or Vickers crack initiation threshold) is measured by a Vickers indenter. Indentation fracture threshold is a measure of indentation damage resistance of the glass. The test involves the use of a square-based pyramidal diamond indenter with an angle of 136° between faces, referred to as a Vickers indenter. The Vickers indenter is same as the one used in standard micro hardness testing (reference ASTM-E384-11). A minimum of five specimens are chosen to represent the glass type and/or pedigree of interest. For each specimen, multiple sets of five indentations are introduced to the specimen surface. Each set of five indentations is introduced at a given load, with each individual indentation separated by a minimum of 5 mm and no closer than 5 mm to a specimen edge. A rate of indenter loading/unloading of 50 kg/minute is used for test loads ≥2 kg. For test loads <2 kg, a rate of 5 kg/minute shall be used. A dwell (i.e., hold) time of 10 seconds at the target load is utilized. The machine maintains load control during the dwell period. After a period of at least 12 hours, the indentations are inspected in under reflected light using a compound microscope at 500× magnification. The presence or absence of median/radial cracks, or specimen fracture, is then noted for each indentation. Note that the formation of lateral cracks is not considered indicative of exhibiting threshold behavior, since this test is concerned with the formation of median/radial cracks, or specimen fracture. The specimen threshold value is defined as the midpoint of the lowest consecutive indentation loads which bracket greater than 50% of the individual indentations meeting threshold. For example, if within an individual specimen 2 of the 5 (40%) indentations induced at a 5 kg load have exceeded threshold, and 3 of the 5 (60%) indentations induced at a 6 kg load have exceeded threshold, then the specimen threshold value is defined as the midpoint of 5 and 6 kg, or 5.5 kg.

The sample mean threshold value is defined as the arithmetic mean of all individual specimen threshold values. Along with the mean, the range (lowest value to highest value) of all the specimen midpoints is reported for each sample. The pre-test, test and post-test environment should ideally be controlled to 23±2° C. and 50±5% RH to minimize variation in the fatigue (stress corrosion) behavior of the glass specimens. It should be noted that when first testing an unfamiliar composition or pedigree, the required indentation loads and bracketing increment must often be determined by performing an "iterative search." Once familiarity with the sample's performance is gained, future testing may be streamlined by testing only those loads near the expected threshold, and then "filling in" additional indentation loads only if necessary.

According to one or more embodiments, the first strengthened substrate comprises a glass as described in U.S. Pat. No. 8,951,927, the entire content of which is incorporated herein by reference. Such glasses, according to one or more embodiments of this disclosure, comprise at least about 50 mol % $SiO_2$; at least about 10 mol % $R_2O$, wherein $R_2O$ comprises $Na_2O$; $Al_2O_3$, wherein $Al_2O_3$ (mol %)<$R_2O$ (mol %); and $B_2O_3$, and wherein $B_2O_3$ (mol %)-($R_2O$ (mol %)-$Al_2O_3$ (mol %))≥3 mol %. In some embodiments, such glasses also comprise 66-74 mol % $SiO_2$; 2.7 mol % $B_2O_3$; 9-22 mol % $Al_2O_3$; 9-20 mol % $Na_2O$; and at least about 0.1 mol % of at least one of MgO and ZnO, wherein R2O+CaO+SrO+BaO—$Al_2O_3$—$B_2O_3$<0. In specific embodiments, the first strengthened substrate comprises a glass comprising at least about 50 mol % $SiO_2$; at least about 10 mol % $R_2O$, wherein $R_2O$ comprises $Na_2O$; $Al_2O_3$; and $B_2O_3$, wherein $B_2O_3$ (mol %)-($R_2O$ (mol %)-$Al_2O_3$ (mol %))≥3 mol %, and wherein the glass has a zircon breakdown temperature that is equal to the temperature at which the glass has a viscosity in a range from about 25 kPoise to about 40 kPoise. In specific embodiments, the first strengthened substrate comprises a glass comprising an ion exchanged glass having a Vickers crack initiation threshold of at least 3 kilogram force (kgf), at least 4 kilogram force (kgf), at least 5 kilogram force (kgf), at least 6 kilogram force (kgf), at least 7 kilogram force (kgf) or at least 8 kilogram force (kgf), at least 9 kilogram force (kgf) or at least 10 kilogram force (kgf), the glass comprising at least about 50 mol % $SiO_2$; at least about 10 mol % $R_2O$, wherein $R_2O$ comprises $Na_2O$; $Al_2O_3$, wherein $Al_2O_3$ (mol %)<$R_2O$ (mol %); $B_2O_3$, wherein $B_2O_3$ (mol %)-($R_2O$ (mol %)-$Al_2O_3$ (mol %))≥3 mol %. In some embodiments, the first strengthened substrate comprises a glass comprising an ion exchanged glass having a Vickers crack initiation threshold of at least 3 kilogram force (kgf), at least 4 kilogram force (kgf), at least 5 kilogram force (kgf), at least 6 kilogram force (kgf), at least 7 kilogram force (kgf) or at least 8 kilogram force (kgf), at least 9 kilogram force (kgf) or at least 10 kilogram force (kgf), the glass comprising 66-74 mol % $SiO_2$; ≥2.7 mol % $B_2O_3$; 9-22 mol % $Al_2O_3$; 9-20 mol % $Na_2O$; and at least about 0.1 mol % of at least one of MgO and ZnO, wherein R2O+CaO+SrO+BaO—$Al_2O_3$—$B_2O_3$<0. In specific embodiments, the first strengthened substrate comprises a glass comprising at least about 50 mol % $SiO_2$; at least about 10 mol % $R_2O$, wherein $R_2O$ comprises $Na_2O$; $Al_2O_3$; and at least 2.7 mol % $B_2O_3$ containing coordinated boron cations, wherein $B_2O_3$—($R_2O$—$Al_2O_3$)≥3 mol %. In specific embodiments, these glasses comprise at least 0.1 mol % of at least one of MgO and ZnO. In specific embodiments, these glasses from about 2.7 mol % to about 4.5 mol % $B_2O_3$. In a highly specific embodiment, the first strengthened substrate comprises a glass comprising 66-74 mol % $SiO_2$; at least about 10 mol % $R_2O$, wherein $R_2O$ comprises $Na_2O$; 9-22 mol % $Al_2O_3$; at least 2.7 mol % $B_2O_3$, wherein $B_2O_3$—($R_2O$—$Al_2O_3$)≥3 mol %; and at least 0.1 mol % of at least one of MgO and ZnO. According to one or more embodiments, at least 50% of the $B_2O_3$ present in the glass comprises three-fold coordinated boron cations. The ion exchanged glass having a high degree of resistance to damage caused by abrasion, scratching, and indentation, comprising alumina, $B_2O_3$, and alkali metal oxides, and containing boron cations having three-fold coordination described immediately above has compressive depth of layer (DOL) less than about 20 μm, less than about 15 μm, or less than about 10 μm, and a thickness less than 1 mm, less than 0.8 mm, less than 0.7 mm, less than 0.6 mm and less than 0.5 mm.

Scratch resistance can be determined by Knoop lateral cracking scratch threshold testing, to understand the lateral scratch threshold limit and scratch visibility. The Knoop indenter is same as the one used in standard micro hardness testing (reference ASTM-E384-11). The Knoop indenter utilized in scratch resistance testing is comprised of nominal 130° and 172.5° included angles, as shown in the ASM International Handbook Volume 08: Mechanical Testing and Evaluation.

To determine lateral scratch threshold minimum 5 samples per glass composition are used. Scratches of constant load is generated, 5 scratches per load, generated at a speed of 0.4 mm/sec. The length of the scratch is about 10 mm. Each set of five scratches is introduced at a given vertical load, with each individual scratch separated by a minimum of 3 mm and no closer than 3 mm to a specimen edge. The measurement unit is Newton's (N). The loading and unloading Rate is not be greater than 14 g/s. The traverse rate and distance is 0.4±0.025 mm/s for a distance of 10.0 mm. The traverse direction is parallel to the long axis of the indenter to within ±2°. Equipment to perform the test can be obtained from Bruker (formerly CETR), Nanovea, CSM Instruments and others. Specimen surfaces are gently cleaned with a non-abrasive cloth (optionally dampened with alcohol) or air canister before or after scratching, being careful to leave no residue or film. The diamond tip is cleaned with an alcohol dampened non-abrasive cloth between each scratch, again leaving no residue or film. For samples with unknown history, the starting load is 0.25N and increased with a delta of 0.25 till 1N load is reached and >1N the delta increase is 1N and beyond 10N the delta increase is 2N. The load is increased starting from 0.25N till the lateral scratch threshold is reached. The samples are inspected after a period of at least 12 hrs under microscope. The lateral scratch threshold range is determined by comparing the test specimen to one of the following failure modes: 1) sustained lateral surface cracks that are more than two times the width of the groove or 2) the presence of large subsurface lateral cracks which are greater than two times the width of groove and/or there is a median crack at the vertex of the scratch. The Inspection Magnification is 100× for locating scratches within the specimen(s) and is 500× for measuring the width of scratch grooves and lateral cracks. Once all data have been collected, the threshold value for each individual specimen is determined, as is the mean threshold value for the glass type or pedigree of interest (based on the sample consisting of 5 specimens). In particular: (i) The specimen threshold value is defined as the midpoint of the lowest consecutive scratch loads which bracket 50% of the individual scratches exceeding threshold. For example, if within an individual specimen 2 of the 5 (40%) scratches induced at a 5.0 N load have exceeded threshold, and 3 of the 5 (60%) scratches induced at a 6.0 N load have exceeded threshold, then the specimen threshold value would be defined as the midpoint of 5.0 and 6.0 N, or 5.5 N. (ii) The sample mean threshold value is defined as the arithmetic mean of all individual specimen threshold values. Along with the mean, the range (lowest value to highest value) of all the specimen midpoints needs to be reported for each sample. It should be noted that when first testing an unfamiliar composition or pedigree, the required scratch loads and bracketing increment must often be determined by performing an "iterative search." Once familiarity with the sample's performance is gained, future testing may be streamlined by testing only those loads near the expected threshold, and then "filling in" additional scratch loads only if necessary. The pre-test, test and post-test environment should ideally be controlled to 23±2° C. and 50±5% RH to minimize variation in the fatigue (stress corrosion) behavior of the glass specimens. According to one or more embodiments, the first strengthened glass substrate has a Knoop scratch resistance of at least at least 3 N, at least 3.5N, at least 4 N, at least 4.5 N, at least 5 N, at least 6 N, at least 7 N, at least 8 N, at least 9N or at least 10 N.

Table 1 below provides exemplary, non-limiting properties of such glasses described immediately above, which are within the ranges of CS, DOL and CT described above.

TABLE 1

| t (mm) | CS (MPa) | CS (+/−) | DOL (microns) | DOL (+/−) | Nominal CT (MPa) | CT-range |
|---|---|---|---|---|---|---|
| 0.2 | 500 | +/−25 | 4 | +/−2 | 10 | 5-17 |
| 0.3 | 550 | +/−30 | 6 | +/−2 | 11 | 7-16 |
| 0.4 | 650 | +/−30 | 6 | +/−3 | 10 | 5-16 |
| 0.5 | 700 | +/−50 | 7 | +/−3 | 10 | 5-16 |
| 0.55 | 750 | +/−50 | 7 | +/−3 | 10 | 5-15 |

In one or more embodiments, the ratio of CS/CT is greater than or equal to 20, greater than or equal to 25, greater than or equal to 30, greater than or equal to 35, greater than or equal to 40, greater than or equal to 45, greater than or equal to 50, greater than or equal to 55, greater than equal to 60, greater than equal to 65, greater than equal to 70, greater than equal to 75, greater than equal to 80, greater than equal to 85, or greater than equal to 90 and the DOL is less than or equal to 10 micrometers, less than or equal to 9 micrometers, less than or equal to 8 micrometers, less than or equal to 7 micrometers or less than or equal to 6 micrometers or less than or equal to 5 micrometers or less than equal to 4 micrometers, or less than equal to 3 micrometers or less than equal to 2 micrometers. In one or more embodiments, the ratio of t/DOL and CS/CT both are greater than or equal to 20, greater than or equal to 25, greater than or equal to 30, greater than or equal to 35, greater than or equal to 40, greater than or equal to 45, greater than or equal to 50, greater than or equal to 55, greater than or equal to 60, greater than or equal to 65, greater than equal to 70, greater than equal to 75, greater than equal to 80, greater than equal to 85, or greater than equal to 90. The exemplary properties provided in Table 1 can be obtained by manufacturing a strengthened glass substrate according to the glass compositions described immediately above comprising alumina, $B_2O_3$, and alkali metal oxides, and containing boron cations having three-fold coordination can be ion exchanged using an ion exchange process which includes placing the glass in a bath containing a suitable potassium salt (e.g., potassium nitrate or chloride) at a concentration in the range of about 70% to about 100% by weight of the bath, for a time ranging from 0.1 hours to 2 hours, for example 0.1 to 0.5 hours, and a temperature in the range of 300° to 450° C., for example, 350° to 420° C. It will be understood that the time, temperature, amount of ion exchange salt can be adjusted to achieve the desired properties (CS, DOL, CT). Thinner glass substrates can be exchanged with higher concentrations of the sodium salt for a shorter period of time, while thicker glass substrates can be exchanged with a lower concentration of the sodium salt a longer period of time. Potassium salts may also be used alone or in combination with a sodium salt, or sequential baths using sodium salts and potassium salts may be utilized.

According to one or more embodiments, the glass substrate has antimicrobial functionality. The term "antimicrobial" refers herein to the ability to kill or inhibit the growth of more than one species of more than one type of microbe (e.g., bacteria, viruses, fungi, and the like). In one or more embodiments, the glass substrate surface has within the first 50 nm from the surface a silver ion concentration in the range of about 1 wt. % and 35 wt. % of the glass substrate on an oxide basis. According to one or more embodiments, the silver ions are present to a depth in the range of about 1 micrometer to 20 micrometers. It should be noted that the depth of silver ion penetration is different than the DOL. Silver ion penetration can be measured by techniques such as EMP (electron microphobe), SIMS (Secondary Ion Mass Spectrometry), or GdOES (Glow discharge Optical Emission Spectrometry). In one or more embodiments, in a glass substrate having antimicrobial functionality, the glass substrate may exhibit a b* value in transmittance (as measured through both major surfaces of the glass substrate) and/or reflectance (as measured from a single surface, excluding the opposing surface reflectance) of less than about 2 (or about 1.8 or less, about 1.6 or less, 1.5 or less, 1.4 or less, 1.2 or less, or about 1 or less) in the CIE L*, a*, b* colorimetry system at normal incidence, under an illuminant. The illuminant can include standard illuminants as determined by the CIE, including A illuminants (representing tungsten-filament lighting), B illuminants (daylight simulating illuminants), C illuminants (daylight simulating illuminants), D series illuminants (representing natural daylight), and F series illuminants (representing various types of fluorescent lighting)). In specific examples, the screen protector exhibits the b* values described herein in transmittance and/or reflectance when viewed at normal incidence under a CIE F2, F10, F11, F12 or D65 illuminant, or more specifically under a CIE D65 or F2 illuminant. In one or more embodiments, the glass substrate having antimicrobial functionality has substantially no discoloration, for example the CIE 1976 color coordinate b* is <2. Substantially no discoloration can include a change in optical transmittance of the glass article of less than or equal to about 3 percent relative to an optical transmittance before exposure to the harsh conditions, a change in haze of the glass article of less than or equal to about 5 percent relative to a haze before exposure to the harsh conditions, and/or a change in CIE 1976 color coordinates L*, a*, and b* of the glass article of less than or equal to about ±0.2, ±0.1, and ±0.1, respectively. In some embodiments, the change in CIE 1976 color coordinates L*, a* and b* of the antimicrobial glass article is less than or equal to about ±0.1, ±0.05, ±0.05, respectively. In one or more embodiments of a substrate having antimicrobial functionality, a glass substrate having antimicrobial functionality has a transmittance higher than 90% over the visible spectrum (i.e., a wavelength range from about 400 nm to about 700 nm). According to one or more embodiments, a glass substrate having antimicrobial functionality has a antimicrobial efficacy (Log Kill) higher than 3 according to Japanese Industrial Standard JIS Z 2801 (2000), entitled "Antimicrobial Products—Test for Antimicrobial Activity and Efficacy." Under the "wet" conditions of JIS Z 2801 (i.e., about 37° C. and greater than 90% humidity for about 24 hours), substrates having antimicrobial properties described herein can exhibit at least a 3 log reduction in the concentration (or a kill rate of 99.999%) of at least Staphylococcus aureus, Enterobacter aerogenes, and Pseudomomas aeruginosa bacteria. In certain implementations, the substrates having antimicrobial properties described herein can exhibit at least a 5 log reduction in the concentration of any bacteria to which it is exposed under these testing conditions.

A glass substrate having antimicrobial functionality can have additional coating layers such easy-to-clean coating (or anti-fingerprint coating of 0.5 nm to 20 nm thickness). The surface can be also antiglare finished (a textured surface). Surface roughness ($R_a$) can be from 0.2 nm to 300 nm.

Antimicrobial properties can be provided to a glass substrate according to the following general process. In one embodiment, the antimicrobial properties can be provided by a one-step process, or multiple-step process in which at least one step is an antimicrobial step which adds an antimicrobial reagent to glass. In one embodiment, a step of adding Ag ions to a glass surface can include an ion-exchange process in molten salt bath, or an aqueous solution at elevated temperature at a pressure equal or greater than 1 atmosphere.

In a specific embodiment, antimicrobial properties are provided in a molten bath where a concentration of $AgNO_3$ can be 0.1 wt. % to 50 wt. % for a one step process, and 0.1 wt. % to 100 wt. % for a multi-step process. In one or more embodiments of a multi-step process in aqueous solution the concentration of $AgNO_3$ can be 0.1 wt. % to saturation (about 90 wt. % in water at 100° C.).

Thus, in a specific embodiment, a thin glass substrate can be provided as described immediately above, and antimicrobial properties can be imparted to the thin glass substrate by ion exchanging silver ions in a bath containing silver nitrate or any other appropriate silver salt. Thereafter, other functional such as anti-fingerprint and/or oleophobic coatings can be applied to the substrate.

In a specific embodiment, of a one-step process, a glass substrate having the following composition in Table 2 can be ion exchanged:

TABLE 2

| oxide | wt. % | mol % |
|---|---|---|
| $SiO_2$ | 61.88 | 67.55 |
| $B_2O_3$ | 3.9 | 3.67 |
| $Al_2O_3$ | 19.69 | 12.67 |
| $Na_2O$ | 12.91 | 13.66 |
| $K_2O$ | 0.02 | 0.010 |
| $Li_2O$ | — | — |
| MgO | 1.43 | 2.33 |
| ZnO | — | — |
| $TiO_2$ | 0.004 | 0.003 |
| CaO | — | — |
| $As_2O_3$ | — | — |
| $Fe_2O_3$ | 0.02 | 0.010 |
| $ZrO_2$ | 0.01 | 0.010 |
| $SnO_2$ | 0.22 | 0.10 |
| SrO | — | — |
| $MnO_2$ | — | — |
| $P_2O_5$ | — | — |

Examples of ion-exchange (IOX) conditions are provided in Table 3. A glass composition as shown in Table 2 was formed into sheets having a thickness of 0.3 mm. According to one or more embodiments, the total concentration of sodium nitrate and silver nitrate was balanced to keep the total bath poison level consistent to the standard IOX condition for the glass composition. The starting glass prior to ion exchange can have a surface roughness from 0.2 nm to 300 nm. In one or more embodiments, the resulting glass (after IOX) includes a silver antimicrobial agent while also exhibiting a resulting CS in the range from about 500 MPa to about 600 MPa. In one or more embodiments, the resulting glass includes a CT in the range from about 5 MPa to about 20 MPa (e.g., from about 5 MPa to about 16 MPa). In one or more embodiments, the resulting glass includes a DOL in the range from about 3 micrometers to about 10 micrometers.

TABLE 3

Exemplary IOX conditions of making using a one-step approach, using a glass having the composition of Table 2 and a thickness of 0.3 mm.

| | $AgNO_3$ in bath (wt. %) | $NaNO_3$ in bath (wt. %) | Temp./ Time |
|---|---|---|---|
| 1 | 0.5 | 25 | 390° C./ 0.3 hr |
| 2 | 1 | 25 | 390° C./ 0.3 hr |
| 3 | 2 | 25 | 390° C./ 0.3 hr |
| 4 | 5 | 20 | 390° C./ 0.3 hr |
| 5 | 25 | 0 | 390° C./ 0.3 hr |

In an exemplary multiple step process, a glass composition of Table 2 formed into sheets having a thickness of 0.3 mm was ion exchanged as follows. A first IOX: 390° C./0.15 hr., $NaNO_3$ concentration in bath is 25 wt. %. Second IOX: described in Table 4.

TABLE 4

| | $AgNO_3$ in bath (wt. %) | $NaNO_3$ in bath (wt. %) | Temp./ Time |
|---|---|---|---|
| 1 | 0.5 | 25 | 390° C./ 0.15 hr |
| 2 | 1 | 25 | 390° C./ 0.15 hr |
| 3 | 2 | 25 | 390° C./ 0.15 hr |
| 4 | 5 | 20 | 390° C./ 0.15 hr |
| 5 | 25 | 0 | 390° C./ 0.15 hr |

In one or more embodiments, the resulting glass (after a one-step IOX process) includes a silver antimicrobial agent that extends to a depth of less than about 10 micrometers. In one or more embodiments, the resulting glass (after a two-step IOX process) includes a silver antimicrobial agent that extends to a depth of less than about 20 micrometers.

In one or more specific embodiments, the first strengthened substrate comprises alkali aluminosilicate glasses that are resistant to damage due to sharp impact and capable of fast ion exchange. Examples of such glasses are disclosed in U.S. Pat. No. 9,156,724, the entire content of which is incorporated herein by reference. Examples of such alkali aluminosilicate glasses comprise at least 4 mol % $P_2O_5$ and, when ion exchanged, have a Vickers crack initiation threshold of at least about 3 kgf, of at least about 4 kgf, of at least about 5 kgf, of at least about 6 kgf or of at least about 7 kgf. In one or more specific embodiments, the first strengthened substrate comprises an alkali aluminosilicate glass comprising at least about 4 mol % $P_2O_5$ and from 0 mol % to about 4 mol % $B_2O_3$, wherein the alkali aluminosilicate glass is $Li_2O$-free and wherein: $1.3<[(P_2O_5+R_2O)/M_2O_3]\leq2.3$; where $M_2O_3=Al_2O_3+B_2O_3$, and $R_2O$ is the sum of monovalent cation oxides present in the alkali aluminosilicate glass. In specific embodiments, such alkali aluminosilicate glasses comprise less than 1 mol % $K_2O$, for example 0 mol % $K_2O$. In specific embodiments, such alkali aluminosilicate glasses comprise less than 1 mol % $B_2O_3$, for example 0 mol % $B_2O_3$. In specific embodiments, such alkali aluminosilicate glasses are ion exchanged to a depth of layer of at least about 10 μm, and the alkali aluminosilicate glass has a compressive layer extending from a surface of the glass to the depth of layer, and wherein the compressive layer is under a compressive stress of at least about 300 MPa. In specific embodiments, such alkali aluminosilicate glasses include monovalent and divalent cation oxides are selected from the group consisting of $Na_2O$, $K_2O$, $Rb_2O$, $Cs_2O$, MgO, CaO, SrO, BaO, and ZnO. In highly specific embodiments, such alkali aluminosilicate glasses comprise from about 40 mol % to about 70 mol % $SiO_2$; from about 11 mol % to about 25 mol % $Al_2O_3$; from about 4 mol % to about 15 mol % $P_2O_5$; and from about 13 mol % to about 25 mol % $Na_2O$.

Glass substrates made from the glass composition described immediately above can be ion-exchanged, for example according to the processes described above to provide exemplary, non-limiting properties provided in Table 1, and which are within the ranges of CS, DOL and CT described above. Furthermore, the glass substrates can be provided with antimicrobial properties as described above, and can be processed according to the procedures described above, for example, in the specific procedures provided in Tables 3 and 4.

Other non-limiting examples of glasses that may be used in the first strengthened substrate may include alkali aluminosilicate glass compositions or alkali aluminoborosilicate glass compositions, though other glass compositions are contemplated. Such glass compositions may be characterized as ion exchangeable. As used herein, "ion exchangeable" means that a substrate comprising the composition is capable of exchanging cations located at or near the surface of the substrate with cations of the same valence that are either larger or smaller in size. One example glass composition comprises $SiO_2$, $B_2O_3$ and $Na_2O$, where $(SiO_2+B_2O_3)$ ≥66 mol. %, and $Na_2O$≥9 mol. %. In an embodiment, the glass composition includes at least 6 wt. % aluminum oxide. In a further embodiment, the substrate includes a glass composition with one or more alkaline earth oxides, such that a content of alkaline earth oxides is at least 5 wt. %. Suitable glass compositions, in some embodiments, further comprise at least one of $K_2O$, MgO, and CaO. In a particular embodiment, the glass compositions used in the substrate can comprise 61-75 mol. % SiO2; 7-15 mol. % $Al_2O_3$; 0-12 mol. % $B_2O_3$; 9-21 mol. % $Na_2O$; 0-4 mol. % $K_2O$; 0-7 mol. % MgO; and 0-3 mol. % CaO.

A further example glass composition suitable for the first strengthened substrate comprises: 60-70 mol. % $SiO_2$; 6-14 mol. % $Al_2O_3$; 0-15 mol. % $B_2O_3$; 0-15 mol. % $Li_2O$; 0-20 mol. % $Na_2O$; 0-10 mol. % $K_2O$; 0-8 mol. % MgO; 0-10 mol. % CaO; 0-5 mol. % $ZrO_2$; 0-1 mol. % $SnO_2$; 0-1 mol. % $CeO_2$; less than 50 ppm $As_2O_3$; and less than 50 ppm $Sb_2O_3$; where 12 mol. %≤$(Li_2O+Na_2O+K_2O)$≤20 mol. % and 0 mol. %≤(MgO+CaO)≤10 mol. %.

A still further example glass composition suitable for the first strengthened glass substrate comprises: 63.5-66.5 mol. % $SiO_2$; 8-12 mol. % $Al_2O_3$; 0-3 mol. % $B_2O_3$; 0-5 mol. % $Li_2O$; 8-18 mol. % $Na_2O$; 0-5 mol. % $K_2O$; 1-7 mol. % MgO; 0-2.5 mol. % CaO; 0-3 mol. % $ZrO_2$; 0.05-0.25 mol. % $SnO_2$; 0.05-0.5 mol. % $CeO_2$; less than 50 ppm $As_2O_3$; and less than 50 ppm $Sb_2O_3$; where 14 mol. %≤$(Li_2O+Na_2O+K_2O)$≤18 mol. % and 2 mol. %≤(MgO+CaO)≤7 mol. %.

In a particular embodiment, an alkali aluminosilicate glass composition suitable for the first strengthened glass substrate comprises alumina, at least one alkali metal and, in some embodiments, greater than 50 mol. % $SiO_2$, in other embodiments at least 58 mol. % $SiO_2$, and in still other embodiments at least 60 mol. % $SiO_2$, wherein the ratio $((Al_2O_3+B_2O_3)/\Sigma modifiers)>1$, where in the ratio the components are expressed in mol. % and the modifiers are alkali metal oxides. This glass composition, in particular embodiments, comprises: 58-72 mol. % $SiO_2$; 9-17 mol. % $Al_2O_3$; 2-12 mol. % $B_2O_3$; 8-16 mol. % $Na_2O$; and 0-4 mol. % $K_2O$, wherein the ratio$((Al_2O_3+B_2O_3)/\Sigma$ modifiers$)>1$.

In still another embodiment, the first strengthened glass substrate may include an alkali aluminosilicate glass composition comprising: 64-68 mol. % $SiO_2$; 12-16 mol. % $Na_2O$; 8-12 mol. % $Al_2O_3$; 0-3 mol. % $B_2O_3$; 2-5 mol. % $K_2O$; 4-6 mol. % MgO; and 0-5 mol. % CaO.

In an alternative embodiment, the first strengthened substrate may comprise an alkali aluminosilicate glass composition comprising: 2 mol % or more of $Al_2O_3$ and/or $ZrO_2$, or 4 mol % or more of $Al_2O_3$ and/or $ZrO_2$.

Figure 2A:
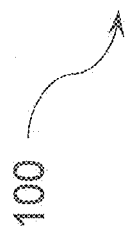
FIG. 2A illustrates an embodiment of a strengthened first substrate.
Figure 2A:
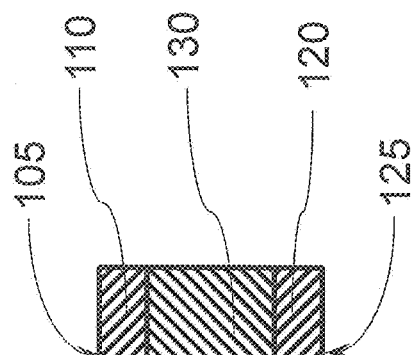

Referring now to FIG. 2A, which illustrates an embodiment of a first strengthened substrate 100. In specific embodiments the first strengthened substrate 100 is a glass substrate, which may be thermally strengthened and/or chemically strengthened. The first strengthened substrate 100 has an external surface 105 and an internal surface 125 opposite the external surface 105, where each of the external surface 105 and internal surface 125 may be ion exchanged to provide chemical strengthening and compressive stress regions 110 and 120. The external surface 105 is exposed to a user of the electronic device and is susceptible to sharp impact damage when the device is dropped.

The compressive stress regions 110, 120 of the first strengthened substrate 100 extend inward from each surface to a DOL (as illustrated in FIG. 1), and there is a central tension region 130 of the glass is between the two compressive stress regions 110, 120. According to one or more embodiments, the first strengthened substrate has a central tension value in the central tension region 130 in the range greater than 0 MPa and less than 20 MPa.

Figure 2B:
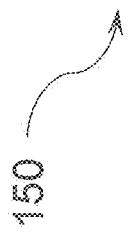
FIG. 2B illustrates an embodiment of a second substrate.
Figure 2B:
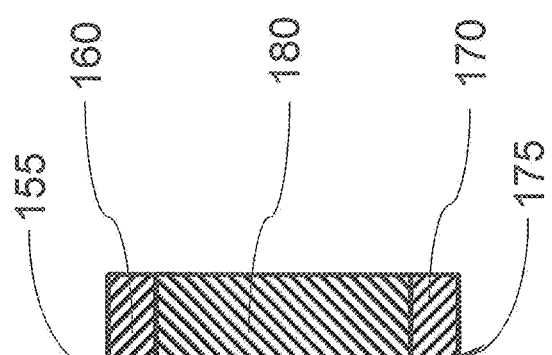

FIG. 2B illustrates embodiments of a second substrate 150, which may be a glass or glass-ceramic substrate. The second substrate 150 has a third surface 155 and a fourth surface 175 opposite the internal surface 125. The second substrate 150 may be thermally strengthened, chemically strengthened or thermally strengthened and chemically strengthened. In embodiments in which the second substrate 150 is chemically strengthened, each of the third surface 155 and the fourth surface 175 may be ion exchanged to provide chemical strengthening. In embodiments in which the second substrate 150 is strengthened, compressive stress regions 160, 170 extend inward from each respective surface 155, 175 to a DOL, and there is central tension region 180 of the glass is between the two compressive stress regions 160, 170.

According to one or more embodiments, the first strengthened substrate described above can be in the form of an aftermarket screen protector that is applied by a user of the device, and the first strengthened substrate is sized and configured to cover a cover glass which covers a display screen of a device, for example a smart phone or tablet device. In other embodiments, the first strengthened substrate described above is a factory-installed cover glass laminate of the device as described further below. Such a laminate could be made in the same operations as a standard cover glass, with the cover glass positioned as the second substrate and having typical properties of cover glass, and the first substrate having the properties of a low CT as described herein. The two substrates could then be laminated prior to being attached to a display unit and integrated into a device assembly. The first strengthened glass substrate has an external or outer surface exposed to the user and an inner surface in contact with the second glass substrate, the outer surface and inner surface of the first strengthened glass. It will be understood that "in contact" does not necessarily mean that the surfaces are in direct contact, and there may be material between the surfaces, namely, an adhesive or other material that holds the substrates together. According to one or more embodiments, the thickness of the first substrate is in the range of 0.025 mm and 0.7 mm, or in the range of 0.025 and 0.6 mm, or in the range of 0.025 and 0.5 mm, or in the range of 0.025 and 0.4 mm, or in the range of 0.025 and 0.3 mm, or in the range of 0.025 and 0.2 mm and all ranges and sub-ranges between the foregoing values.

Figure 3:
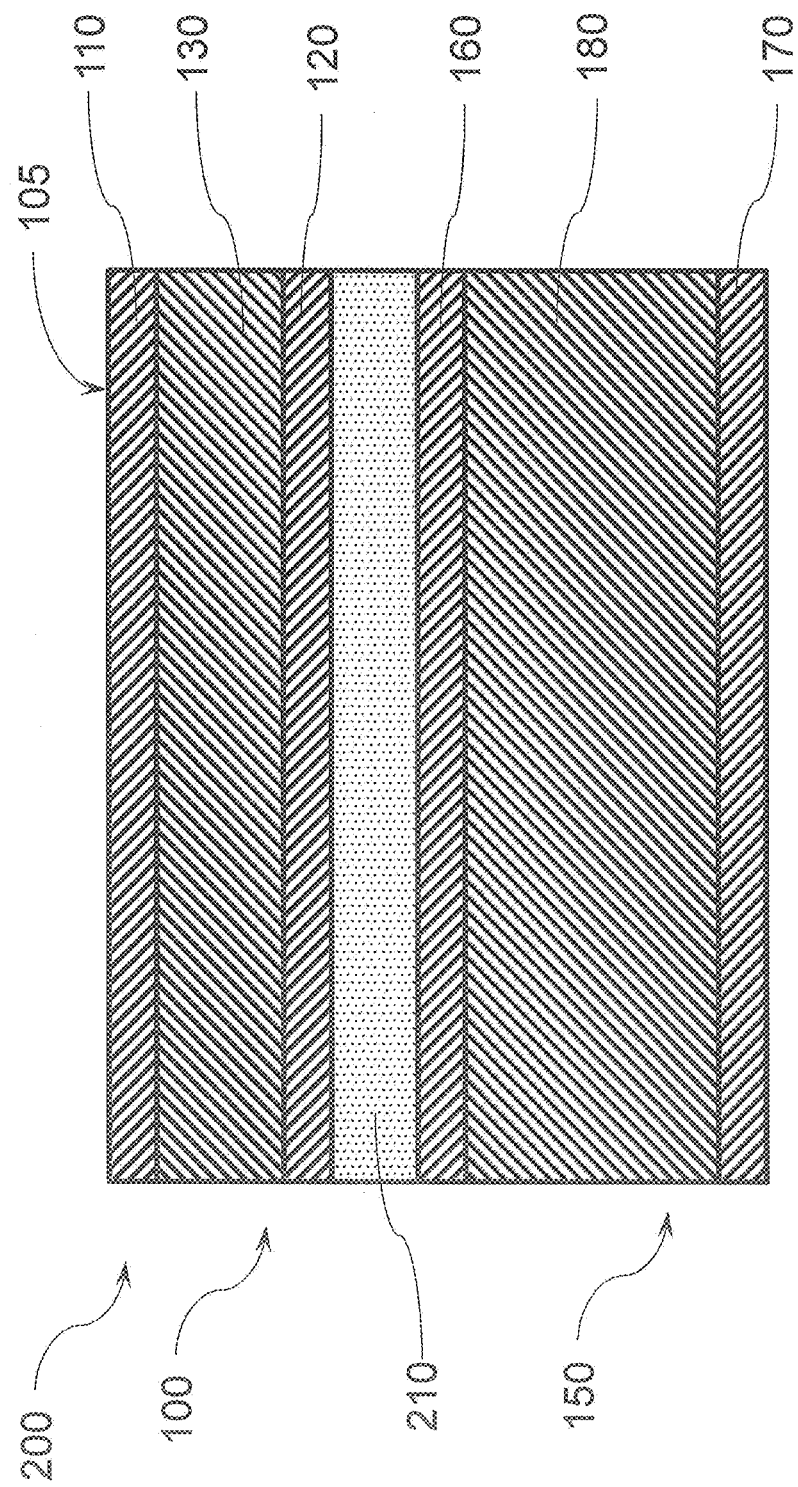
FIG. 3 illustrates the substrates of FIGS. 2A and 2B laminated together.

FIG. 3 illustrates an embodiment of a laminate 200 having the first strengthened substrate 100 shown in FIG. 2A and the second strengthened substrate 150 shown in FIG. 2B laminated together. The laminate 200 comprises the first strengthened substrate 100 having a first thickness laminated by an adhesive layer 210 to a second substrate 150 having a second thickness different than the first thickness. It will be understood, however, that in some embodiments, the first strengthened substrate 100 and the second substrate 150 can have the same thickness. The interlayer may be a polymer interlayer selected from the group consisting of polyvinyl butyral, ethylenevinylacetate, polyvinyl chloride, ionomers, silicone, acrylics, thermoplastic polyurethane, and combinations thereof. The interlayer can also comprise a silicone-based adhesive, and in specific embodiments, a silicone adhesive that is self-wetting and can be removed easily and reapplied. The interlayer can also be a pressure sensitive adhesive according to one or more embodiments. In other embodiments, the interlayer can comprise a metal fluoride adhesive. The interlayer can have a thickness in the range of 20 micrometers and 200 micrometers.

Figure 4:
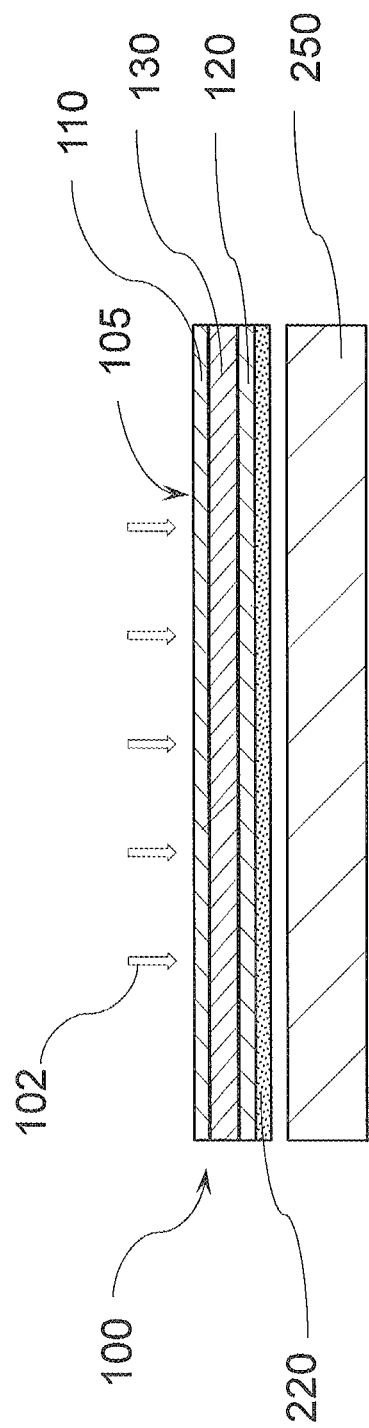
FIG. 4 illustrates the strengthened external substrate of FIG. 2A being applied to a second substrate.
Figure 5:
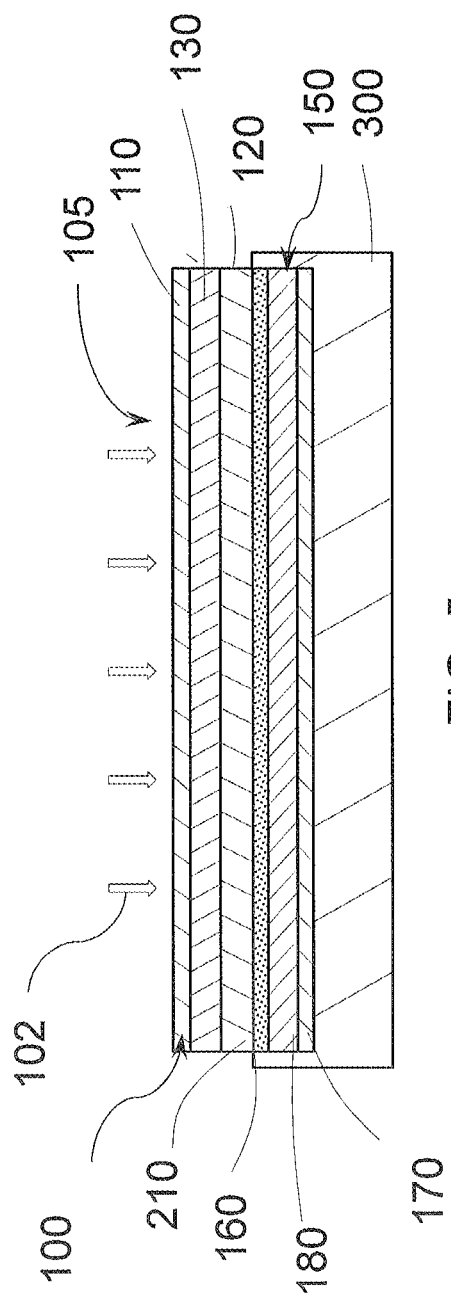
FIG. 5 illustrates a device including the strengthened external substrate of FIG. 2A applied to a handheld device.

FIG. 4 shows the first strengthened substrate 100 shown in FIG. 2A in the form of an aftermarket screen protector, including an adhesive layer 220, which can be applied to a cover glass 250 of a device (not shown) by applying the substrate 100 in the direction of arrows 102. The cover glass 250 can be a strengthened glass substrate (e.g., thermally strengthened or chemically strengthened) or it may be unstrengthened. FIG. 5 shows the first strengthened substrate 100 shown in FIG. 2A laminated to the second strengthened substrate 150 shown in FIG. 2B and assembled to a device 300 as a finished product. As can be seen, the second glass substrate is not exposed to the user of the handheld electronic device. Thus, FIG. 5 shows a handheld device display screen protector comprising a first strengthened substrate sized and configured to cover a display screen of a handheld electronic device, the first strengthened glass substrate having a central tension value in the range greater than 0 MPa and less than 20 MPa and an external surface 105 exposed to a user of the handheld electronic device, the first strengthened glass substrate laminated to an internal substrate that is not exposed to the user of the handheld electronic device; and an adhesive layer 210 between the first chemically strengthened glass substrate and the second substrate. As noted above, the second substrate 150 can be a standard cover glass and first strengthened substrate 130 provides additional protection to the display of the electronic device.

Another aspect of the disclosure pertains to a method of protecting a display screen of an electronic device, the method comprising covering a screen of the electronic device with a first strengthened glass substrate having a central tension value in the range greater than 0 MPa and less than 20 MPa and a surface exposed to a user of the electronic device as described herein. According to an embodiment, the first strengthened glass substrate is selected from the group consisting of a chemically strengthened glass substrate, a thermally strengthened glass substrate and a chemically and thermally strengthened glass substrate.

In one or more method embodiments, the electronic device includes a cover glass and the first strengthened glass substrate is an aftermarket screen protector and the method comprises applying the first strengthened glass substrate to the cover glass with an adhesive. In an embodiment, the first chemically strengthened glass substrate has a compressive stress value in the range of 20 MPa and 300 MPa and a depth of layer value in the range of 30 μm and 100 μm. In another embodiment, the first chemically strengthened glass substrate has a compressive stress value in the range of 300 MPa and 900 MPa (for example in a range of 500 MPa and 900 MPa) and a depth of layer value in the range of 2 μm and 20 μm (for example in a range of 2 μm and 12 μm). In another embodiment, the first chemically strengthened glass substrate has a compressive stress value in the range of 300 MPa and 900 MPa and a depth of layer value in the range of 2 μm and 12 μm.

In another method embodiment, the first chemically strengthened glass substrate is laminated to a second glass substrate with an adhesive providing a laminate cover glass that covers the screen of the electronic device.

Figure 6:
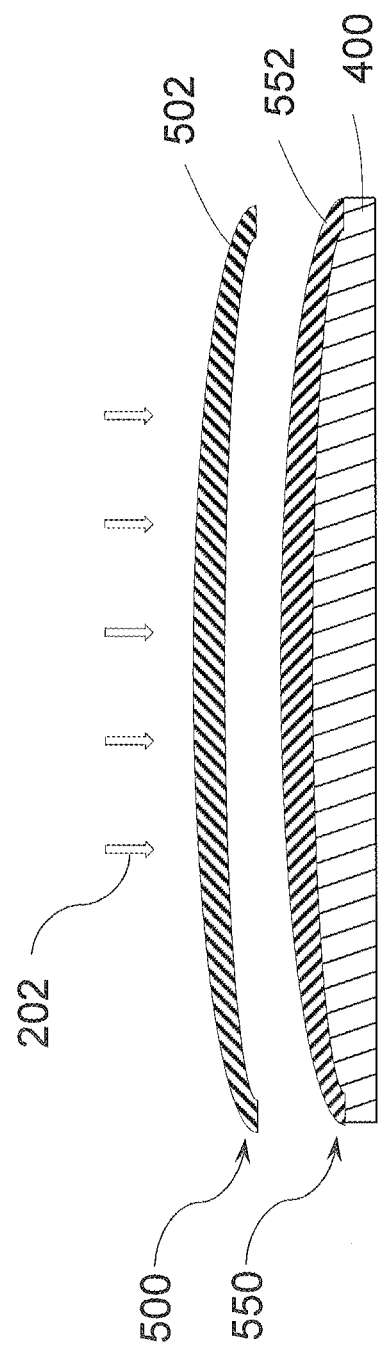
FIG. 6 illustrates a device including a strengthened external substrate applied to a handheld device with a curved cover substrate.

According to one or more embodiments, the disclosure provides a screen protector and a method of making mechanically-advantaged and better damage resistance after-market cover glass screen protectors and cover glass laminate for devices, in particular handheld mobile electronic devices that include a display screen. By providing a first substrate with a CT value in the range of 0 to 20 MPa by any (CS/DOL) combination (e.g., Low CS/High DOL; High CS/Low DOL; Mid CS/Low DOL) or no ion exchange can improve the product performance specific to premature product failure. This attribute combined with choice of Corning® Glass, for example, Native Damage Resistance™ glass (NDR) glass provides improved resistance to surface damage of the first substrate. The first substrate can be made with the specified CS/DOL conditions covering wide range of mobile electronics applications with various types cover glass shapes (two dimensional and three dimensional) and sizes. According to one or more embodiments, the first substrate can have a three dimensional profile to provide edge to edge coverage of a shaped cover glass on an electronic device such as a mobile phone or a tablet. FIG. 6 shows a first strengthened curved substrate 500 having a curved surface 502 being applied to a second strengthened curved substrate 550 having a curved surface 552 on a handheld device 400. For ease of illustration, the various regions of the glass such as compressive stress regions and central tension regions of the first strengthened curved substrate 500 and a second strengthened curved substrate 550 are not shown in FIG. 6. Likewise, an interlayer between the first strengthened curved substrate 500 and the second strengthened curved substrate 550 is not shown, but in one or more embodiments, an interlayer is utilized to bond the first strengthened curved substrate 500 and the second strengthened curved substrate 550. The interlayer may be a polymer interlayer selected from the group consisting of polyvinyl butyral, ethylenevinylacetate, polyvinyl chloride, ionomers, silicone, acrylics, thermoplastic polyurethane and combinations thereof. The interlayer can also be a pressure sensitive adhesive according to one or more embodiments. The interlayer can have a thickness in the range of 20 micrometers and 200 micrometers. As can be seen, the second strengthened curved substrate 550 is not exposed to the user of the handheld electronic device, and the first strengthened curved substrate 500 provides edge to edge protection for the second strengthened curved substrate 550.

According to one or more embodiments, when a mobile device protected by a first strengthened substrate in the form of a screen protector encounters a drop event, typically the edges come into contact with the drop surface. Even with the presence or absence of any bending event, damage occurs around the periphery area at first. As the edges of the screen protector are exposed, when the peripheral damage/flaw occurs and if the central tension of the protector is <20 MPa the fracture does not propagate in the display area and is contained in the localized area. If the central tension >20 MPa, due to CT level, the damage introduction exceeds the critical stress intensity level and the screen protector cracks immediately with fracture propagating instantly in the glass (≥1500 m/sec). The stress intensity factor ($K_I$) is defined as $K_I = Y\sigma_a\sqrt{a}$, where a is the flaw depth, $\sigma_a$ applied stress, Y is the geometrical constant. Increase in applied stress, flaw depth or both would increase the stress intensity factor ($K_I$). When $K_I \geq K_{IC}$ ie: stress intensity factor ($K_I$) equal or exceeds critical stress intensity limit $K_{IC}$, crack propagation occurs. In one or more embodiments, for this application, this condition occurs for CT limits exceeding 20 MPa. In embodiments in which the first strengthened substrate is in the form of a screen protector described herein having Native Damage Resistance™ (NDR) properties is advantageous for sharp contact surface damage and scratches compared to comparative glasses. With the presence of compressive stress (CS) the fracture strength ($\sigma_f$) of the glass is increased, and the applied load (e.g.: sharp contact flaw introduction) must overcome the residual compressive stress before the crack experiences tensile stress $\sigma_f = K_{ic}/(Y\sqrt{a}) + \sigma_{comp}$.

According to one or more embodiments in which the strengthened external substrate is an aftermarket screen protector, the first substrate may incorporate privacy filter films, additional coatings and surface treatments to reduce glare, reflections, fingerprints, and scratches, and other features not included in the cover glass of the device. More specifically, the strengthened external substrate can include one or more scratch resistant films, such as AlON or SiON, antireflective and anti-glare films or surface treatments, privacy screens, antimicrobial properties (e.g., $Ag^+$ and/or Cu ions), oleophobic coatings and/or hydrophobic coatings, an energy absorbing layer, and sacrificial polymer layers, such as polyethylene terephthalate (PET), which can be self-healing. These additional films can be placed between the adhesive layer and the internal surface of the strengthened external substrate.

According to one or more embodiments, surface treatments, such as sandblasting and/or etching, can produce similar anti-glare effects without the application of a coating. Sacrificial polymer coatings, such as PET, which can also be self-healing, may also be placed on the surface of the screen protector. Films can be placed on the back surface of screen protectors as well. One such feature that can be incorporated on the back of a screen protector is a privacy film, which restricts viewing of the device at indirect angles. Additionally, if plastic is used for the device cover, a UV-blocking layer can be incorporated into the back surface of the screen protector to prevent damage from UV rays to the plastic. The screen protector also allows for the potential to ion-exchange silver or other metal ions (e.g., Cu) into the surface for antimicrobial touch surfaces. Drop performance of the screen protector and cover glass can be enhanced by introducing a soft, energy-absorbing layer under the screen protector to mitigate the threat of concentrated forces. Because demand for such features on cover glasses that are supplied with devices screens may be too low, or the features too expensive, aftermarket screen protectors provide a platform for customization to specific user needs.

Various embodiments include a first embodiment directed to a device display screen protector comprising a first strengthened substrate sized and configured to cover a display screen of an electronic device, the first strengthened substrate having a central tension (CT) value in the range greater than 0 MPa and less than 20 MPa and a surface having a Knoop lateral cracking scratch threshold of at least 3 N. In a second embodiment, the first strengthened substrate of the first embodiment is a strengthened glass substrate selected from the group consisting of a chemically strengthened glass substrate, a thermally strengthened glass substrate and a chemically and thermally strengthened glass substrate. In a third embodiment, the second embodiment further comprises a second glass substrate adhered to the first strengthened glass substrate such that the second glass substrate is not exposed to the user of the electronic device. In a fourth embodiment, the first strengthened glass substrate of the second or third embodiment, the surface having a Knoop lateral cracking scratch threshold of at least 3 N is an outer surface and the first strengthened glass substrate includes an inner surface in contact with the second glass substrate, the outer surface and inner surface of the first strengthened glass substrate defining a thickness in the range of 0.025 mm and 0.7 mm. In a fifth embodiment, the first strengthened glass substrate of the second through fourth embodiments is a chemically strengthened glass substrate having a compressive stress (CS) value in the range of 20 MPa and 300 MPa and a depth of layer (DOL) value in the range of 30 μm and 100 μm. In a sixth embodiment, the first strengthened glass substrate of the second through fourth embodiments is a chemically strengthened glass substrate having a compressive stress value in the range of 300 MPa and 900 MPa and a depth of layer value in the range of 2 μm and 20 μm.

In a seventh embodiment, the first strengthened glass substrate of the second through fourth embodiments is a chemically strengthened glass substrate having a compressive stress value in the range of 300 MPa and 500 MPa and a depth of layer value in the range of 2 μm and 20 μm.

In an eighth embodiment, the first strengthened glass substrate of the first through fourth embodiments is an aftermarket screen protector comprising a chemically strengthened glass substrate having a thickness in the range of 0.025 and 0.7 mm and a compressive stress value in the range of 20 MPa and 300 MPa and a depth of layer value in the range of 30 µm and 100 µm. In a ninth embodiment, the first strengthened glass substrate of the first through fourth embodiments is an aftermarket screen protector comprising a chemically strengthened glass substrate having a thickness in the range of 0.025 and 0.7 mm and a compressive stress value in the range of 500 MPa and 900 MPa and a depth of layer value in the range of 2 µm and 20 µm. In a tenth embodiment, the first strengthened glass substrate of the first through fourth embodiments is an aftermarket screen protector comprising a chemically strengthened glass substrate having a thickness in the range of 0.025 and 0.7 mm and a compressive stress value in the range of 300 MPa and 500 MPa and a depth of layer value in the range of 2 µm and 20 µm.

In an eleventh embodiment, the second glass substrate and the first strengthened glass substrate of the third embodiment are adhered together with an adhesive. In a twelfth embodiment, the screen protector of the eighth embodiment is a laminate and the adhesive is selected from the group consisting of polyvinyl butyral, ethylenevinylacetate, polyvinyl chloride, ionomers, silicone, acrylics, thermoplastic polyurethane, and combinations thereof.

In a thirteenth embodiment, the first through ninth embodiments further comprise one or more of a scratch resistant film, an antireflective film, an anti-glare film, a privacy screen, an antimicrobial additive, an oleophobic coating, a hydrophobic coating, an energy absorbing layer, and a sacrificial polymer layer.

In a fourteenth embodiment, the first strengthened glass substrate of the first through thirteenth embodiments comprises ion exchangeable glass having a high degree of resistance to damage caused by abrasion, scratching, and indentation. In a fifteenth embodiment, the glass of the fourteenth embodiment comprises alumina, $B_2O_3$, and alkali metal oxides, and contains boron cations having three-fold coordination. In a fifteenth embodiment, the first strengthened glass substrate of the first through fourteenth embodiments has a Vickers crack initiation threshold of at least 3 kilogram force (kgf).

In sixteenth embodiment, the screen protector of the first through fifteenth embodiments has a curved surface.

In a seventeenth embodiment, the first strengthened glass substrate of the first through thirteenth embodiments comprises ion exchangeable glass having a high degree of resistance to damage caused by abrasion, scratching, and indentation, and the glass is an alkali aluminosilicate glasses that is resistant to damage due to sharp impact. In an eighteenth embodiment, the glass of the seventeenth embodiment comprises at least 4 mol % $P_2O_5$ and, the first strengthened glass substrate has a Vickers indentation crack initiation load of at least about 3 kgf. In a nineteenth embodiment, the glass of the seventeenth and eighteenth embodiments comprises an alkali aluminosilicate glass comprising at least about 4 mol % $P_2O_5$ and from 0 mol % to about 4 mol % $B_2O_3$, wherein the alkali aluminosilicate glass is $Li_2O$-free and wherein: $1.3<[P_2O_5+R_2O/M_2O_3] \leq 2.3$; where $M_2O_3=Al_2O_3+B_2O_3$, and $R_2O$ is the sum of monovalent cation oxides present in the alkali aluminosilicate glass. In a twentieth embodiment, the screen protector of the first through nineteenth embodiments has a curved surface.

A twenty-first embodiment pertains to device display screen protector comprising a first strengthened glass substrate sized and configured to cover a display screen of an electronic device, the first strengthened glass substrate having a central tension value in the range greater than 0 MPa and less than 20 MPa and a surface exposed to a user of the handheld electronic device, the first strengthened glass substrate laminated to a second substrate that is not exposed to the user of the handheld electronic device; and an adhesive layer between the first strengthened glass substrate and the second substrate, the first strengthened glass substrate having a Knoop lateral cracking scratch threshold of at least 3 N. In a twenty-second embodiment, the first strengthened glass substrate of the twenty first embodiment is selected from the group consisting of a chemically strengthened glass substrate, a thermally strengthened glass substrate and a chemically and thermally strengthened glass substrate. In a twenty-third embodiment, wherein the screen protector of the twenty first and twenty second embodiments has a curved surface.

A twenty-fourth embodiment pertains to a method of protecting a display screen of an electronic device, the method comprising covering a screen of the electronic device with a first strengthened substrate having a central tension (CT) value in the range greater than 0 MPa and less than 20 MPa and a surface having a Knoop lateral cracking scratch threshold of at least 3 N. In a twenty-fifth embodiment, the first strengthened substrate in the twenty-fourth embodiment is a glass substrate selected from the group consisting of a chemically strengthened glass substrate, a thermally strengthened glass substrate and a chemically and thermally strengthened glass substrate. In a twenty-sixth embodiment, the electronic device of the twenty fifth embodiment includes a cover glass and the first strengthened glass substrate is an aftermarket screen protector and the method comprises applying the first strengthened glass substrate to the cover glass with an adhesive. In a twenty-seventh embodiment, the first strengthened glass substrate of the twenty fourth through the twenty sixth embodiments is a chemically strengthened glass substrate having a compressive stress value in the range of 20 MPa and 300 MPa and a depth of layer value in the range of 30 µm and 100 µm. In a twenty-eighth embodiment, the first strengthened glass substrate of the twenty fourth through the twenty sixth embodiments is a chemically strengthened glass substrate having a compressive stress value in the range of 300 MPa and 900 MPa and a depth of layer value in the range of 2 µm and 20 µm. In a twenty ninth embodiment, the first strengthened glass substrate of the twenty fourth through the twenty-sixth embodiments is a chemically strengthened glass substrate having a compressive stress value in the range of 300 MPa and 500 MPa and a depth of layer value in the range of 2 µm and 20 µm.

In a thirtieth embodiment, the first strengthened glass substrate of the twenty fifth embodiment is laminated to a second glass substrate with an adhesive providing a laminate cover glass that covers the screen of the electronic device. In a thirty-first embodiment, the first strengthened glass substrate of the thirtieth embodiment is a chemically strengthened glass substrate having a compressive stress value in the range of 20 MPa and 300 MPa and a depth of layer value in the range of 30 µm and 100 µm. In a thirty-second embodiment, the first strengthened glass substrate of the thirtieth embodiment is a chemically strengthened glass substrate having a compressive stress value in the range of 300 MPa and 900 MPa and a depth of layer value in the range of 2 µm and 20 µm. In a thirty-third embodiment, the first strengthened glass substrate of the thirtieth embodiment is a chemically strengthened glass substrate having a compressive stress value in the range of 300 MPa and 500 MPa and a depth of layer value in the range of 2 µm and 20 µm.

In a thirty-fourth embodiment, any of the fifth through twenty-third embodiments can have the feature that the first strengthened substrate has a ratio of CS/CT is greater than or equal to 20, greater than or equal to 25, greater than or equal to 30, greater than or equal to 35, greater than or equal to 40, greater than or equal to 45, greater than or equal to 50, greater than or equal to 55, greater than equal to 60, greater than equal to 65, greater than equal to 70, greater than equal to 75, greater than equal to 80, greater than equal to 85, or greater than equal to 90 and the DOL is less than or equal to 10 micrometers. In a thirty-fifth embodiment, any of the fifth through twenty-third embodiments can have the feature that the first strengthened substrate has a ratio of t/DOL and CS/CT both are greater than or equal to 20, greater than or equal to 25, greater than or equal to 30, greater than or equal to 35, greater than or equal to 40, greater than or equal to 45, greater than or equal to 50, greater than or equal to 55, greater than equal to 60, greater than equal to 65, greater than equal to 70, greater than equal to 75, greater than equal to 80, greater than equal to 85, or greater than equal to 90. In a thirty-sixth embodiment, any of the fifth through twenty-third embodiments can have the feature that the first strengthened substrate has a ratio of t/DOL and CS/CT both are greater than or equal to 20, greater than or equal to 25, greater than or equal to 30, greater than or equal to 35, greater than or equal to 40, greater than or equal to 45, greater than or equal to 50, greater than or equal to 55, greater than equal to 60, greater than equal to 65, greater than equal to 70, greater than equal to 75, greater than equal to 80, greater than equal to 85, or greater than equal to 90.

In a thirty-seventh embodiment, a device is provided comprising a housing having a front surface, a back surface, and side surfaces; electrical components provided at least partially inside the housing; a display at or adjacent the front surface of the housing; and the display screen protector of any one of embodiments 1-28 and 34-36 disposed over the display. In a thirty-eighth embodiment, the device according to the thirty-seventh embodiment, further comprising a cover glass disposed over the display, wherein the display screen protector is disposed over the cover glass.

EXAMPLES

Preparation of Glass Substrates

Example 1

Glass substrates having a thickness of 0.4 mm and having the composition in Table 2 above were prepared and ion-exchanged to have the surface CS, DOL, and CT listed in Table 1 above for 0.4 mm thickness.

Preparation of Comparative Glass Substrates

Comparative Example 2 (SLG). Soda lime glass substrates were provided having a thickness of 0.4 mm that were ion exchanged to have a surface CS of about 505 MPa, a DOL of about 6.5 µm, and a CT of about 8 MPa.

Comparative Example 3 (ASG). Commercially available aluminosilicate glass substrates were provided having a thickness of 0.4 mm that were ion exchanged to have a surface CS of about 772 MPa, a DOL of about 42 µm, and a CT of about 103 MPa.

Figure 7:
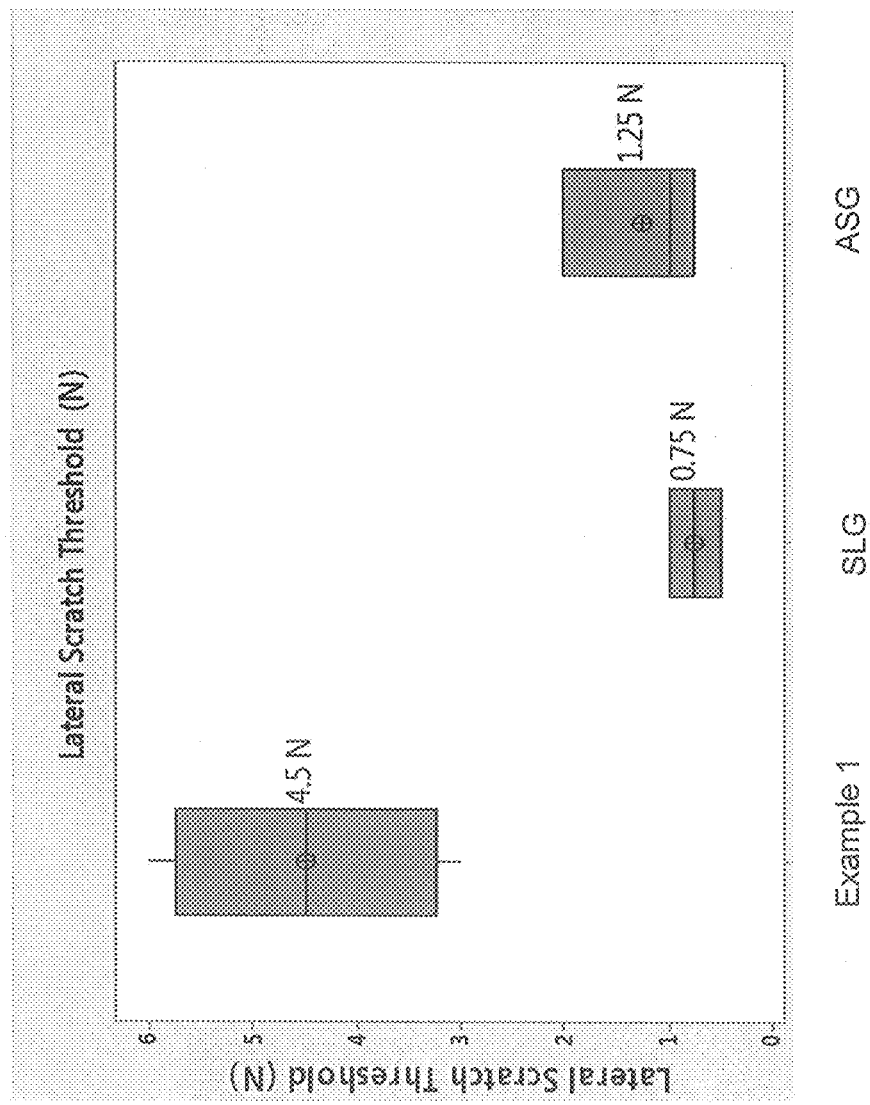
FIG. 7 is a graph showing Knoop lateral cracking scratch threshold data.

Scratch Testing 0.4 mm samples of Comparative Example 2 (SLG), Comparative Example 3 (ASG) and Example 1 were provided. Knoop lateral cracking scratch threshold was determined for each using the procedure discussed above. As shown in FIG. 7, Example 1 had an average Knoop lateral cracking scratch threshold of 4.5 N, SLG had an average Knoop lateral cracking scratch threshold of 0.75 N, and ASG had an average Knoop lateral cracking scratch threshold of 1.25 N. Because of the optimized composition and process conditions of Example 1, the performance of Example 1 is significantly better than the comparative examples.

Figure 8:
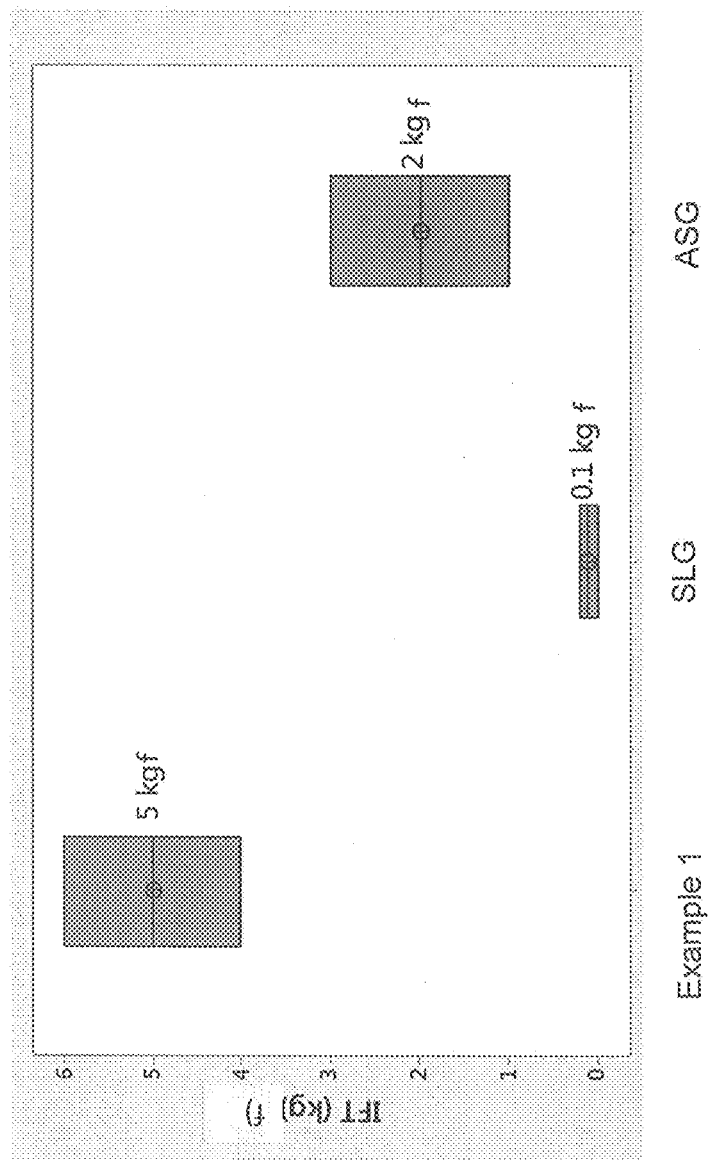
FIG. 8 is a graph showing indentation fracture threshold data.

Fracture Performance 0.4 mm samples of Comparative Example 2 (SLG), Comparative Example 3 (ASG) and Example 1 were provided. Indentation Fracture Threshold was determined for each using the procedure discussed above. As shown in FIG. 8, Example 1 had an average indentation fracture threshold of 5 kgf, SLG had an average indentation fracture threshold of 0.1 kgf, and ASG had an average indentation fracture threshold of 2 kgf. Because of the optimized composition and process conditions of Example 1, the performance of Example 1 is significantly better than the comparative examples.

Figure 9:
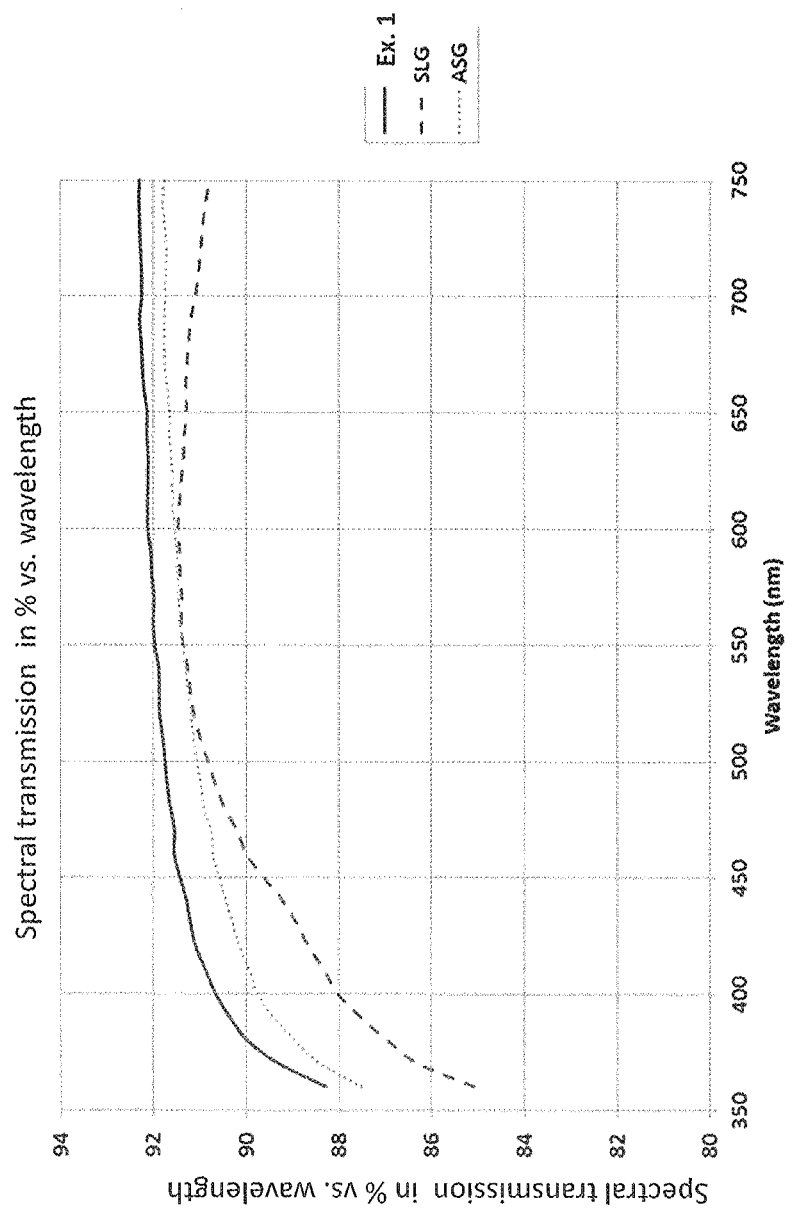
FIG. 9 is a graph showing spectral transmission data.

Optical Properties 0.4 mm samples of Comparative Example 2 (SLG), Comparative Example 3 (ASG) and Example 1 were provided. Spectral transmission, Haze, Clarity and Color were measured. The spectral transmission is shown in FIG. 9. The transmission and color was measured with high efficiency X-rite Color i7 spectrometer in the wavelength range 360-750 nm covering visual spectral range with sources including CIE CWF (cool white fluorescence), CIE D65 (simulated daylight), CIE A (incandescent light). Measurements are done with SCI (specular component included) as well SCE (specular component excluded). The L*, a*, and b* color coordinates were calculated and reported following CIE standards. The Haze and Clarity was measured with BYK haze-gard plus instrument and displays the results adhering to the ASTM and ISO standard test methods (ASTM D1003, ISO 13468).

| Condition | Haze % | Clarity % |
|---|---|---|
| Example 1 | 0.88 | 100 |
| SLG | 0.93 | 100 |
| ASG | 0.89 | 100 |

| Condition | L* | a* | b* |
|---|---|---|---|
| Example 1 | 96.79 | 0.00 | 0.36 |
| SLG | 96.48 | −0.26 | 0.90 |
| ASG | 96.52 | −0.01 | 0.68 |

The results above show that Example 1 has excellent transmission of (>91% 400-700 nm wavelength of interest), Haze (<1%), Clarity (100%) and color (b*<0.5 better than SLG) indicates there is no adverse impact on the user experience when the screen protector is added to the device. These measurements were done with the adhesive layer in place to mimic the actual usage of this invention.

Drop Performance After Scratch Damage

Figure 10:
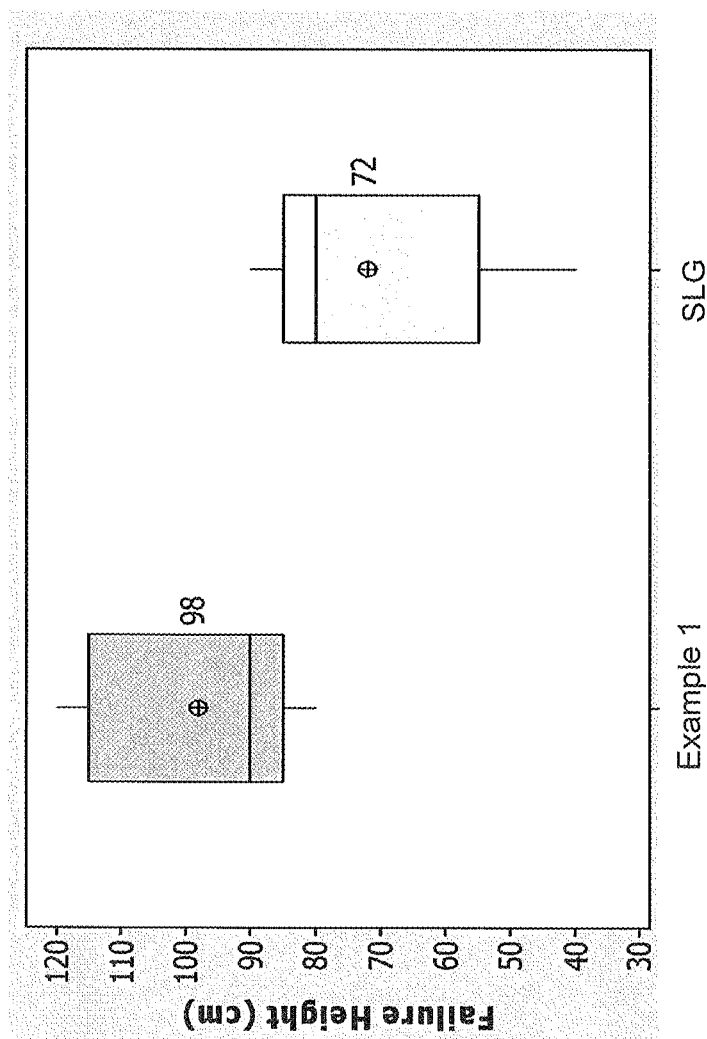
FIG. 10 is a graph showing flat face drop failure height data on a smooth surface after tumbling.

Soda lime glass samples (SLG) were compared to samples prepared in accordance with Example 1, both samples having a thickness of 0.4 mm. The purpose of this test was to simulate field scratch events/flaws on the screen protector surface and then overstressing these flaws by dropping them on a smooth granite surface. The test samples mounted on a mobile device were first tumbled for 45 minutes to replicate field scratch events on a screen protector, one sample at a time. The tumbler has common items that could be found in someone's pocket or purse (House keys, Coins, Cosmetics, Emery board etc.). After 45 mins tumble and 12 hrs wait period, the samples were flat face dropped on a smooth granite surface. The test part was mounted on a commercially available drop test machine (Yoshida Seiki drop tester, Model-DT-205H, manufactured by Shinyei Technology Co, Japan) and aligned flat to the drop surface (smooth granite). The drop height was sequentially increased by 10 cm increment from a start height of 22 cm until the test sample failed (ie: crack on the display area of the screen protector) and the corresponding failure height was noted. Typically about 10 samples per condition were tested and the average failure height was calculated. FIG. 10 shows that the substrate of Example 1 had an average failure height of 98 centimeters, and the SLG sample had an average failure height of 72 centimeters. No drop test data available for ASG parts, as these parts failed during the tumble process itself.

Drop Tests on 180 Grit Sandpaper

Figure 11:
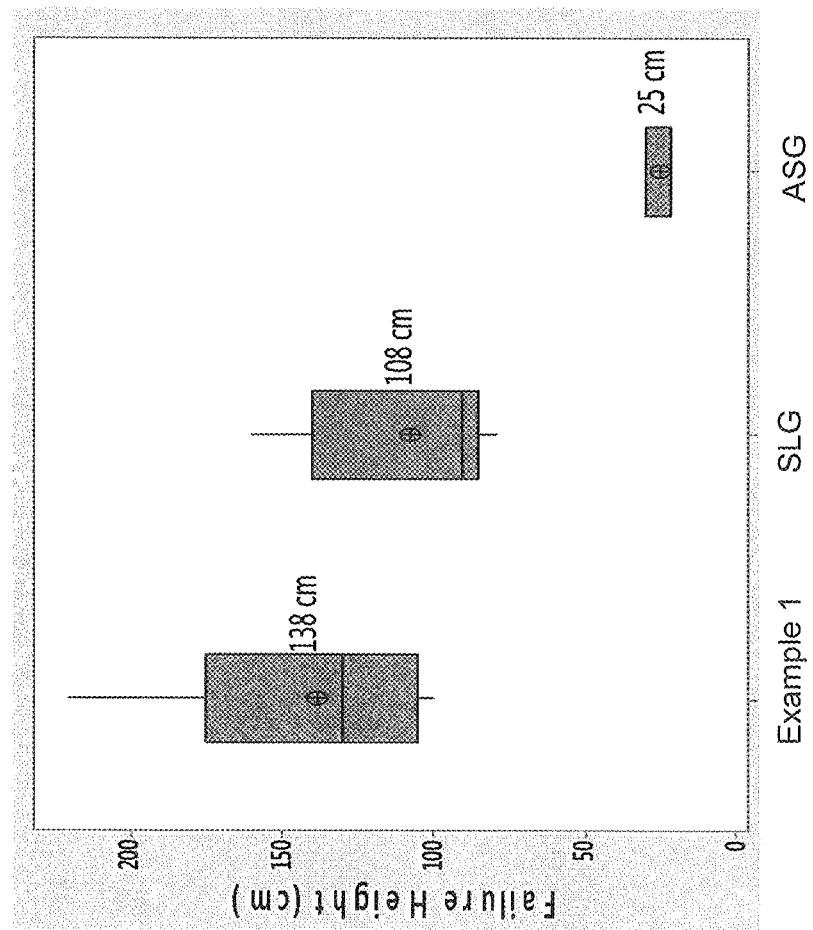
FIG. 11 is a graph showing flat drop failure height data on a 180 grit alumina sandpaper surface.
Figure 12:
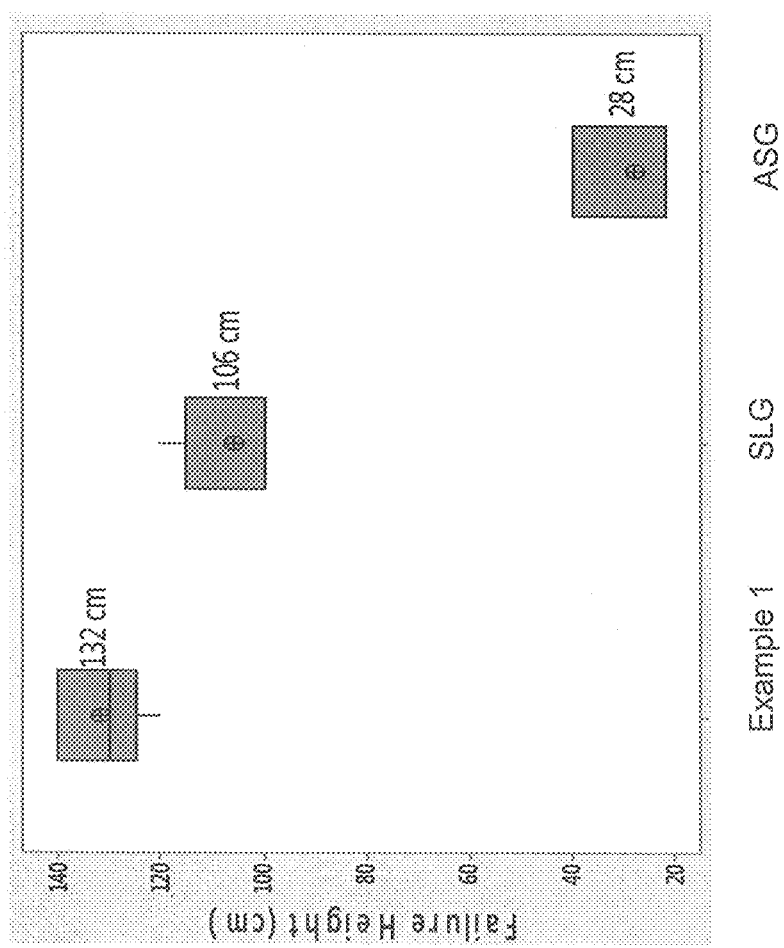
FIG. 12 is a graph showing 30 degree angle drop failure height data on a 180 grit alumina sandpaper surface.

Glass substrates made according to Example 1 were compared to Comparative Example 2 (SLG) and Comparative Example 3 (ASG), each sample being 0.4 mm thick. The purpose of this test was to simulate field failures due to sharp contact damage of the Screen protectors for drop events on various real world rough surfaces like granite, asphalt etc. Experience has shown that the topography and sharpness of 180 grit sand paper ($Al_2O_3$ particles embedded on a glue matrix) closely mimic real world rough surfaces. Using 180 grit sandpaper, controlled test data can be generated so that one can make a fair comparison between sample of interest and comparative samples. The sand paper was changed every test sample enabling consistency. The samples of interest and comparative samples were tested in two "independent test" configurations (i) Flat face drop, where test sample comes in contact full face on the 180 grit rough surface and (ii) 30 degree angle drop, where the tested sample comes in contact at an angle with a flexure/bending event on the 180 grit rough surface. The test sample on a mobile device, was mounted on a commercially available drop test machine (Yoshida Seiki drop tester, Model-DT-205H, manufactured by Shinyei Technology Co, Japan) (i) aligned flat to the 180 grit drop surface and (ii) aligned at 30 degree angle to the 180 grit drop surface. The drop height was sequentially increased by 10 centimeter increments from a start height of 22 centimeters until the sample failed (crack on the display area of the screen protector) and the failure height was noted. Typically about 10 samples per condition and per orientation were tested and the average failure height was calculated. FIG. 11 shows that the flat drop average failure height of the Example 1 substrate being 138 cm, for the SLG sample being 108 cm and the ASG sample 25 cm. FIG. 12 shows the 30 degree angle drop test results. The average failure height for the Example 1 substrate was 132 cm, the failure height for the SLG sample being 106 cm and the failure height for the ASG sample being 28 cm. These results show that the glass according to Example 1 performed significantly better than both soda lime glass and the commercially available Aluminosilicate glass substrates.

Figure 14:
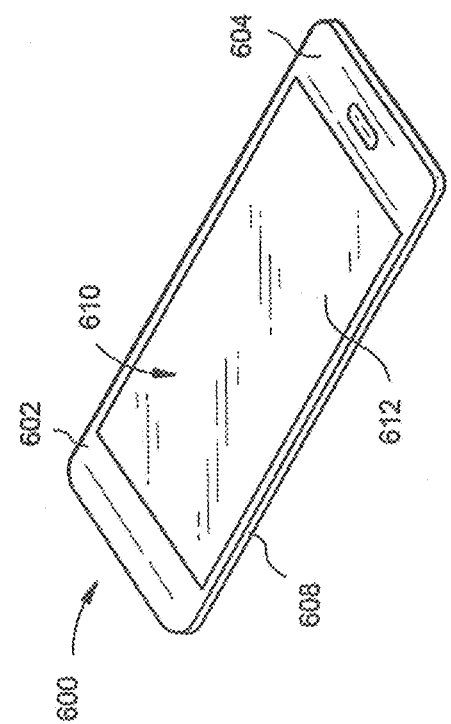
FIG. 14 is a perspective view of the exemplary electronic device of FIG. 13.
Figure 13:
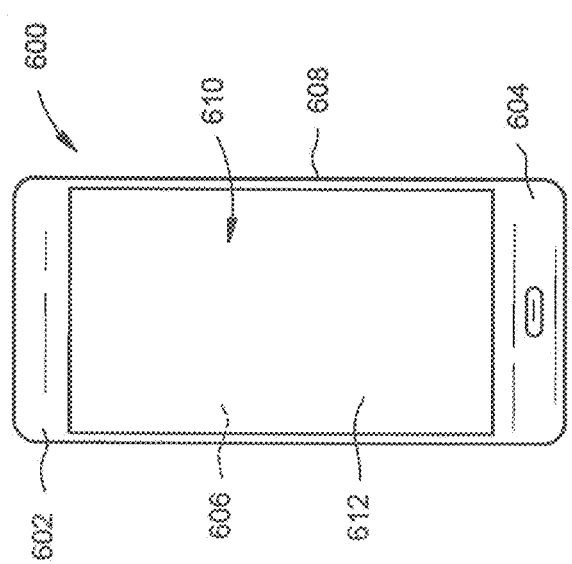
FIG. 13 is a plan view of an exemplary electronic device incorporating any of the strengthened substrates disclosed herein.

According to one or more embodiments, the screen protectors described herein can be used as a screen protector of an electronic device. The strengthened substrates disclosed herein may be incorporated into another article such as an electronic device with a display (or display articles) (e.g., consumer electronics, including mobile phones, tablets, computers, navigation systems, and the like), architectural articles, transportation articles (e.g., automotive, trains, aircraft, sea craft, etc.), appliance articles, or any article that requires some transparency, scratch-resistance, abrasion resistance or a combination thereof. An exemplary article incorporating any of the strengthened substrates disclosed herein is shown in FIGS. 13 and 14. Specifically, FIGS. 13 and 14 show a consumer electronic device 600 including a housing 602 having front 604, back 606, and side surfaces 608; electrical components (not shown) that are at least partially inside or entirely within the housing and including at least a controller, a memory, and a display 610 at or adjacent to the front surface of the housing; and a cover substrate 612 at or over the front surface of the housing such that it is over the display 610. In some embodiments, the cover substrate 612 may include any of the strengthened substrates disclosed herein. For example, the cover substrate 612 may comprise the first strengthened glass substrate as an aftermarket screen protector as described herein laminated over a cover glass of a device, as shown in FIG. 4. In this configuration, the first strengthened substrate is an aftermarket substrate that is separately supplied and applied to the device after the device, including a cover glass integrated with the device, has been manufactured. Thus, with an aftermarket substrates, the first strengthened substrate can be applied by an end user of the device or other personnel such as a store employee to the cover substrate 612 such that the aftermarket substrate overlies the cover substrate 612. Alternatively, the device 600 may be manufactured such that the cover substrate 612 comprises the first strengthened glass substrate laminated to a second glass substrate 150 of the device, for example, as shown in FIG. 5. In this configuration, therefore, the cover substrate 612 comprises a laminate that may be formed when the device is manufactured by the original manufacturer of the device.

The electronic device housing 602 can include the display 610. The display 610 can include a plurality of touch and display components that are laminated together. The touch and display components can, for example, include a display technology layer (e.g., LCD panel), a sensing layer (e.g., touch sensors) and/or a backlight layer. The display 610 is secured within the electronic device housing 602. In one embodiment, the display 610 can be secured to a bottom surface of the cover substrate 612 by a layer of adhesive. Alternatively or additionally, in another embodiment, the touch display 610 can be secured to the housing 602 via brackets, adhesive or other means. The electronic device 600 housing 602 may have any suitable shape, including, for example, one or more elements that may be combined to form a rectangular structure. The housing 602 may at least partially enclose an inner volume in which electronic device components may be assembled and retained. The shape of housing 602 may substantially define boundaries of the inner volume, and may be determined based upon the size and type of components placed within the inner volume.

The housing 602 may have any suitable size, and the size may be determined based on any suitable criteria. Suitable criteria may include, but are not limited to including, aesthetics or industrial design, structural considerations, components required for a desired functionality, and/or product design. The housing 602 may have any suitable cross-section, including for example a variable cross-section or a constant cross-section. In some embodiments, the cross-section may be selected based on desired structural properties for housing 602. For example, the cross-section of housing 602 may be substantially rectangular, such that the height of housing 602 is substantially larger than the width of housing 602. Such a cross-sectional shape may provide structural stiffness in compression and tension, as well as in bending. In some embodiments, the dimensions of housing 602 cross-section may be determined relative to the dimensions of the components contained by housing 602. In some embodiments, housing 602 may include additional features (not shown), including one or more openings, knobs, extensions, flanges, chamfers, or other features for receiving components or elements of the device. The features of the housing 602 can extend from any surface of housing, including for example from internal surfaces, e.g., to retain internal components or component layers, or from external surfaces. In particular, the housing 602 may include a slot or opening (not shown) for receiving a card or tray within the electronic device 600. The housing 602 may also include a connector opening (not shown), e.g., for a 30-pin connector, through which a connector may engage one or more conductive pins of the electronic device 600. Other features that can be included on the housing 602 may include, but are not limited to, an opening for providing audio to a user, an opening for receiving audio from a user, an opening for a connector (e.g., audio connector or power supply connector), and/or features for retaining and enabling a button such as a volume control or silencing switch.

While the foregoing is directed to various embodiments, other and further embodiments of the disclosure may be devised without departing from the basic scope thereof, and the scope thereof is determined by the claims that follow.

What is claimed is:

1. A device display screen protector comprising a first strengthened substrate sized to cover a display screen of an electronic device, the first strengthened substrate comprising a thickness (t) in a range of from 0.025 mm to 0.7 mm, a compressive stress depth of layer (DOL) of less than about 15 μm, a compressive stress (CS) value in a range of 300 MPa to 900 MPa, and a surface having a Knoop lateral cracking scratch threshold of at least 3 N.

2. The device display screen protector of claim 1, wherein the first strengthened glass substrate comprises from 66 to 74 mol % $SiO_2$, greater than or equal to 2.7 mol % $B_2O_3$, from 9 to 22 mol % $Al_2O_3$, from 9 to 20 mol % $Na_2O$, and least about 0.1 mol % MgO and ZnO, wherein $R_2O+CaO+SrO+BaO-Al_2O_3-B_2O_3$ is less than 0, wherein $R_2O$ is the sum of monovalent cation oxides present in the glass or glass-ceramic.

3. The device display screen protector of claim 1, wherein the Knoop lateral cracking scratch threshold is at least 5 N.

4. The device display screen protector of claim 1, wherein the first strengthened substrate is a first strengthened glass substrate selected from the group consisting of a chemically strengthened glass substrate, a thermally strengthened glass substrate and a chemically and thermally strengthened glass substrate.

5. The device display screen protector of claim 4, further comprising a second glass substrate adhered to the first strengthened glass substrate, the second glass substrate not being exposed to the user of the device when the protector is disposed on the electronic device.

6. The device display screen protector of claim 3, wherein the surface having a Knoop lateral cracking scratch threshold of at least 5 N is an outer surface, and the first strengthened glass substrate has an inner surface in contact with the second glass substrate, the outer surface and inner surface of the first strengthened glass substrate defining a thickness (t) in a range of 0.025 mm and 0.4 mm.

7. The device display screen protector of claim 4, wherein the first strengthened glass substrate has a thickness (t), a compressive stress (CS) value in a range of 300 MPa to 900 MPa and a depth of layer (DOL) value in a range of 2 μm to 15 μm.

8. The device display screen protector of claim 4, wherein the first strengthened glass substrate is a screen protector comprising a chemically strengthened glass substrate having a depth of layer value in the range of 2 μm to 12 μm.

9. The device display screen protector of claim 1, further comprising one or more of a scratch resistant film, an antireflective film, an anti-glare film, a privacy screen, an antimicrobial additive, an oleophobic coating, a hydrophobic coating, an energy absorbing layer, and a sacrificial polymer layer.

10. The device display screen protector of claim 1, wherein the first strengthened glass substrate comprises alumina, $B_2O_3$, and alkali metal oxides.

11. The device display screen protector of claim 1, wherein the first strengthened glass substrate has a Vickers crack initiation threshold of at least 3 kilogram force (kgf).

12. The device display screen protector of claim 1, wherein the screen protector has a compressive depth of layer value in the range of 2 μm and 15 μm.

13. The device display screen protector of claim 1, wherein the screen protector comprises a curved primary surface.

14. The device display screen protector of claim 1, wherein the first strengthened substrate has a ratio of compressive stress (CS) to central tension (CT) such that CS/CT is greater than or equal to 20, and the DOL is less than or equal to 10 μm.

15. The device display screen protector of claim 1, wherein the first strengthened substrate has a ratio of t/DOL greater than or equal to 20 and a ratio of compressive stress (CS) to central tension (CT) such that CS/CT is greater than or equal to 20.

16. A device comprising:
    a housing having a front surface, a back surface, and side surfaces;
    electrical components provided at least partially inside the housing;
    a display at or adjacent the front surface of the housing; and
    the display screen protector of claim 1 disposed over the display.

17. The device of claim 16, further comprising a cover glass disposed over the display, wherein the display screen protector is disposed over the cover glass.

* * * * *